(12) United States Patent
Tanimoto et al.

(10) Patent No.: US 7,105,842 B2
(45) Date of Patent: Sep. 12, 2006

(54) METHOD OF CHARGED PARTICLE BEAM LITHOGRAPHY AND EQUIPMENT FOR CHARGED PARTICLE BEAM LITHOGRAPHY

(75) Inventors: Sayaka Tanimoto, Kodaira (JP); Yasunari Sohda, Kawasaki (JP); Yoshinori Nakayama, Sayama (JP); Osamu Kamimura, Kokubunji (JP); Haruo Yoda, Hinode (JP); Masaki Hosoda, Kanagawa (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 10/958,141

(22) Filed: Oct. 5, 2004

(65) Prior Publication Data
US 2005/0072941 A1    Apr. 7, 2005

(30) Foreign Application Priority Data
Oct. 7, 2003    (JP)    ............................. 2003-348354

(51) Int. Cl.
*H01J 37/302*    (2006.01)
*G03F 7/20*    (2006.01)
(52) U.S. Cl. ............................. 250/492.22; 250/492.23
(58) Field of Classification Search .................. None
See application file for complete search history.

(56) References Cited

U.S. PATENT DOCUMENTS 4,430,571 A * 2/1984 Smith et al. ............. 250/492.2
6,498,349 B1 * 12/2002 Thomas et al. ............. 250/398
6,617,587 B1 * 9/2003 Parker et al. ................ 250/398

FOREIGN PATENT DOCUMENTS

| JP | 05-275322 | 7/1992 |
|---|---|---|
| JP | 10-106931 | 10/1996 |
| JP | 11-186144 | 12/1997 |
| JP | 2000-43317 | 7/1998 |
| JP | 2000-252198 | 3/1999 |
| JP | 2001-267221 | 3/2000 |
| JP | 2002-319532 | 4/2001 |

* cited by examiner

Primary Examiner—Jack I. Berman
(74) Attorney, Agent, or Firm—Reed Smith LLP; Stanley P. Fisher, Esq.; Juan Carlos A. Marquez. Esq.

(57) ABSTRACT

Disclosed is equipment for charged-particle beam lithography capable of executing exposure even when an electron beam with a bad property is produced due to a failure in some multibeam forming element, without replacing the failing multibeam forming element and without reducing the exposure accuracy. The equipment includes means for forming a plurality of charged-particle beams arranged at predetermined intervals; a plurality of blankers which act on the plurality of charged-particle beams individually; a common blanker which acts on all of the plurality of charged-particle beams; and a blanking restriction for causing those charged-particle beams which are given predetermined deflection by the plurality of blankers to reach onto a sample, with a signal applied to the common blanker, and blocking those charged-particle beams which are not given the predetermined deflection by the plurality of blankers to the sample. The equipment blocks beams with bad properties to the sample and executes exposure using only those beams which have bad properties.

14 Claims, 26 Drawing Sheets

WIDTH OF THE STRIPE

WIDTH OF THE STRIPE

WIDTH OF THE STRIPE

WIDTH OF THE STRIPE

WIDTH OF THE STRIPE

WIDTH OF THE STRIPE

WIDTH OF THE STRIPE

WIDTH OF THE STRIPE

METHOD OF CHARGED PARTICLE BEAM LITHOGRAPHY AND EQUIPMENT FOR CHARGED PARTICLE BEAM LITHOGRAPHY

CLAIM OF PRIORITY

The present invention claims priority from Japanese application JP 2003-348354 field on Oct. 7, 2003, the content of which is hereby incorporated by reference on to this application.

BACKGROUND OF THE INVENTION

The present invention relates to a semiconductor manufacture technology to be used in semiconductor processes, and, more particularly, to an exposure technology for charged-particle beam lithography which exposes a pattern on a substrate like a wafer, or a master like a mask or reticle using a plurality of charged-particle beams.

With the recent remarkable advancement on the miniaturization of circuit patterns and high scale integration, the electron beam exposure that is used in fabrication of photomasks demands a higher processing speed as well as a higher accuracy. The direct exposure system which directly exposes a pattern on a wafer using an electron beam and which is promising as the next generation lithography technology faces the throughput as the first challenge for mass production of devices.

To improve the throughput, the electron beam exposure is advancing in the direction of increasing the area of electron beams that can be irradiated at a time. As the point beam system that uses point beams suffers a poor throughput too low for mass production, the variable forming system that uses beams having size-changeable rectangular cross sections has been developed. While the system has a throughput higher by one to two digits than the point beam system, it still has a lot of issues on the throughput that should be cleared for exposure of miniaturized patterns with high integration. Developed in this respect is the cell projection system that makes the cross section of a beam into a desired shape using a cell mask with respect to specific patterns which are frequently used. While this system has a large merit on semiconductor circuits which involve many repetitive patterns, such as a memory circuit, it is hard to achieve for semiconductor circuits which involve few repetitive patterns, such as a logic circuit, because of multiple patterns that should be prepared on a cell mask.

One way to solve the problem is a multibeam system which irradiates a plurality of electron beams on a sample, deflects the electron beams to scan on the sample, and individually turns on or off the electron beams according to a pattern to be exposed, thereby exposing the pattern. Because this system can expose an arbitrary pattern without using a mask, the throughput can be improved further.

Such multibeam electron beam exposing systems are disclosed in, for example, Japanese Patent Application Laid-Open No. 2001-267221 and Japanese Patent Application Laid-Open No. 2002-319532. An example of an electron beam exposing apparatus will be described referring to a schematic diagram in FIG. 1.

Reference symbol "101" denotes a crossover image which is formed by an electron gun. With the crossover 101 being a light source, a condenser lens 102 forms an approximately parallel electron beams. The condenser lens in this example is an electromagnetic lens. Reference symbol "103" is an aperture array having apertures arrayed two-dimensionally. Reference symbol "104" is a lens array having electrostatic lenses having the same focal length arrayed two-dimensionally. Reference symbols "105" and "106" are deflector arrays each having a two-dimensional array of electrostatic deflectors which can be driven individually. Reference symbol "107" is a blanker array having a two-dimensional array of electrostatic blankers which can be driven individually.

The approximately parallel electron beams formed by the condenser lens 102 are split into a plurality of electron beams by the aperture array 103. The split electron beams form intermediate images of the crossover 101 at the height of the blanker array 107 by the respective electrostatic lenses of the lens array 104. At this time, the deflector arrays 105 and 106 individually adjust the paths of the electron beams to cause the associated intermediate images of the electron sources to pass at desired positions in the associated blankers in the blanker array 107.

The blankers in the blanker array 107 individually control whether or not to irradiate the associated electron beams on a sample 115. Specifically, the electron beam that is deflected by the associated blanker is blocked by a blanking restriction 109 and is not irradiated on the sample 115. As the electron beam that is not deflected by the blanker array 107 is not blocked by the blanking restriction 109, the beam is irradiated on the sample 115.

As mentioned above, the aperture array 103, the lens array 104, the deflector arrays 105 and 106, and the blanker array 107 form a plurality of intermediate images of the crossover and control whether or not to irradiate each electron beam on the sample 115. The aperture array 103, the lens array 104, the deflector arrays 105 and 106, and the blanker array 107 together are called a multibeam forming device 108.

The intermediate images of the crossover that are formed by the multibeam forming device 108 and are individually controlled whether or not to be irradiated on the sample 115 are projected in reduced size on the sample 115 set on a stage 116 by electromagnetic lenses 110, 111, 112 and 113. The position of the size-reduced projected image is determined by the amount of deflection by a deflector 114.

For such a multibeam system, a method of detecting the occurrence of a failure and the location of a failure in a blanking aperture array which forms a charged-particle beam has been proposed as disclosed in, for example, Japanese Patent Application Laid-Open No. 11-186144.

Further, Japanese Patent Application Laid-Open No. 2000-43317, for example, proposes a method capable of performing an exposure process even with some LDs broken or unable to emit light in a multibeam exposure apparatus using LDs.

SUMMARY OF THE INVENTION

When there is a fault in a multibeam forming device in such a multibeam system, the following problems may arise.
(1) A specific beam is unable to reach a sample.
(2) A specific beam cannot be blocked to a sample.
(3) The property of a specific beam is degraded.

To cope with the problems, Japanese Patent Application Laid-Open No. 11-186144 proposes the method of detecting the occurrence of a failure and the location of a failure in a blanking aperture array which forms a charged-particle beam. Even if the location of a failure is specified, it is necessary to interrupt the exposure process over a long period of time to repair or replace a failed part, readjust the apparatus and start the process again.

As mentioned above, Japanese Patent Application Laid-Open No. 2000-43317 proposes the method of performing an exposure process even when some LDs in a multibeam exposure apparatus using LDs are broken or unable to emit light. Because the exposure apparatus using LDs irradiates a beam (light) on a target to be exposed (hereinafter referred to as "exposure target") as a voltage is applied to the associated device (LD), no beam is unnecessarily irradiated onto the exposure target when the associated device fails.

By way of comparison, an exposure apparatus using a charged-particle beam blocks a beam to an exposure target as a voltage is supplied to the associated device (blanker). When a device (blanker) fails, therefore, an unnecessary beam is irradiated onto the exposure target.

Accordingly, it is an object of the invention to provide a technique of charged-particle beam lithography which can execute an exposure process without dropping the processing speed as much as possible even when a charged-particle beam fails due to a failure in the associated multibeam forming device.

To achieve the object, the invention has the following characteristics. Representative structural examples of the invention will be discussed below.

(1) According to the first aspect of the invention, there is provided a method of charged-particle beam lithography which forms a plurality of charged-particle beams arranged at predetermined intervals, and individually blanks the plurality of charged-particle beams using blanking means to irradiate a charged-particle beam according to a pattern to be exposed on an exposure target, wherein an exposure process is executed by blocking that specific beam in the plurality of charged-particle beams which is not suited for exposure to the exposure target by another means from the blanking means.

(2) According to the second aspect of the invention, there is provided a method of charged-particle beam lithography which forms a plurality of charged-particle beams arranged at predetermined intervals, and individually blanks the plurality of charged-particle beams to irradiate a charged-particle beam according to a pattern to be exposed on an exposure target, the method comprising the steps of:

individually measuring properties of the plurality of charged-particle beams;

selecting a group of beams comprised of those of the measured charged-particle beams which fulfill a predetermined criterion as beams to be used in exposure;

normally blocking remaining beams to the exposure target during exposure; and exposing the exposure target using the selected beams.

(3) According to the third aspect of the invention, there is provided a method of charged-particle beam lithography which individually assigns elements of field to a plurality of charged-particle beams based on pattern data to be exposed, and irradiates a charged-particle beam according to the pattern data to be exposed on an exposure target, the method comprising:

a first step of individually measuring properties of the plurality of charged-particle beams;

a second step of selecting a group of beams comprised of those of the charged-particle beams whose properties measured at the first step fulfill a predetermined criterion as beams to be used in exposure, and normally blocking remaining beams to the exposure target during exposure;

a third step of exposing the elements of field assigned to the beams selected for exposure at the second step using the selected beams;

a fourth step of selecting beams for exposure of those elements of field which are assigned to the beams blocked at the second step, in place of the blocked beams, from those of the charged-particle beams whose properties measured at the first step fulfill the criterion; and a fifth step of exposing the elements of field assigned to the beams blocked at the second step using the beams selected at the fourth step.

(4) According to the fourth aspect of the invention, there is provided a method of charged-particle beam lithography having a step of deflecting a plurality of charged-particle beams arranged in an M×N matrix according to a pattern to be exposed while continuously moving a stage on which an exposure target is set, with a minimum deflection width as a unit, individually controlling irradiation of beams for each deflection, and exposing the pattern on elements of field respectively assigned to the plurality of charged-particle beams, thereby exposing a sub-field comprised of M×N elements of field, a step of exposing a main-field comprised of a plurality of sub-fields laid out in a direction orthogonal to a direction of the continuous movement by sequentially exposing the plurality of sub-fields, the method comprising:

a first step of individually measuring properties of the plurality of charged-particle beams;

a second step of selecting a group of sequential m×n beams comprised of those of the charged-particle beams whose properties measured at the first step fulfill a predetermined criterion as beams to be used in exposure, and normally blocking remaining beams to the exposure target during exposure; and a third step of performing exposure taking m×n elements of field assigned to the beams for exposure selected at the second step as a single sub-field.

(5) According to the fifth aspect of the invention, there is provided equipment for charged-particle beam lithography, comprising:

means for forming a plurality of charged-particle beams arranged at predetermined intervals;

first blanking means which acts on the plurality of charged-particle beams individually;

second blanking means which acts on all of the plurality of charged-particle beams; and restriction means for causing those charged-particle beams which are given predetermined deflection by the first blanking means to reach onto an exposure target, with a signal applied to the second blanking means, and blocking those charged-particle beams which are not given the predetermined deflection by the first blanking means to the exposure target.

(6) In the equipment for charged-particle beam lithography according to the fifth aspect, the first blanking means is comprised of a plurality of blankers which act on the plurality of charged-particle beams individually, and the second blanking means is accomplished by a common blanker.

(7) According to the sixth aspect of the invention, there is provided equipment for charged-particle beam lithography which forms a plurality of charged-particle beams arranged at predetermined intervals, and blanks the plurality of charged-particle beams using first blanking means to irradiate a charged-particle beam according to a pattern to be exposed on an exposure target, comprising:

second blanking means located at an upstream of the first blanking means and comprised of a plurality of blankers which act on the plurality of charged-particle beams individually; and control means for controlling the first blanking means and the second blanking means in such a way as to cause those of the measured charged-particle beams which fulfill a predetermined criterion to reach the exposure target, and block those charged-particle beams which do not fulfill the criterion to the exposure target.

(8) According to the seventh aspect of the invention, there is provided equipment for charged-particle beam lithography, comprising:

means for forming a plurality of charged-particle beams arranged at predetermined intervals;

blanking means having a plurality of blankers which act on each of the plurality of charged-particle beams individually; and restriction means which causes those charged-particle beams which are given predetermined deflection by the blanking means to reach onto an exposure target, blocks those charged-particle beams which are not given the predetermined deflection by the blanking means to the exposure target, and is so arranged as to be eccentric to beam axes of the charged-particle beams.

(9) According to the eighth aspect of the invention, there is provided equipment for charged-particle beam lithography, comprising:

means for forming a plurality of charged-particle beams arranged at predetermined intervals;

blanking means which acts the plurality of charged-particle beams individually;

means for irradiating a charged-particle beam according to pattern data to be exposed on an exposure target as the plurality of charged-particle beams are blanked individually by the blanking means;

shutter means which is provided movable in a plane approximately perpendicular to a traveling direction of the charged-particle beam on a traveling path of the charged-particle beam and has an aperture capable of selectively passing the plurality of charged-particle beams; and control means which controls the pattern data in such a way that exposure is carried out with that charged-particle beam which is caused to selectively pass through the aperture of the shutter means.

(10) In the equipment for charged-particle beam lithography according to the eighth aspect, the shutter means includes two shutters provided independently movable in a plane approximately perpendicular to the traveling direction of the charged-particle beam on the traveling path of the charged-particle beam.

(11) According to the ninth aspect of the invention, there is provided equipment for charged-particle beam lithography, comprising:

charged-particle forming means for forming a plurality of charged-particle beams arranged in an M×N matrix;

blanking means having M×N blankers which act the plurality of charged-particle beams individually;

M×N lenses for individual converging the plurality of charged-particle beams;

means for irradiating the charged-particle beams according to pattern data to be exposed on an exposure target;

means for forming relief charged-particle beams to relieve beams with bad properties whose traveling to the exposure target is blocked by the blanking means when the beams with the bad properties are present in the plurality of charged-particle beams;

a relief lens for individually conversing the relief charged-particle beams formed;

relieve blanking means for individually blanking the relief charged-particle beams; and a relief blanker control circuit which individually controls the relief blanking means, whereby those elements of field which are assigned to the blocked beams are exposed with the relief charged-particle beams.

(12) According to the tenth aspect of the invention, there is provided equipment for charged-particle beam lithography comprising:

an aperture array having a plurality of apertures for forming a plurality of charged-particle beams arranged at predetermined intervals;

a lens array having a plurality of lenses laid out to individually convert the plurality of charged-particle beams which pass the aperture array;

a first stage arranged in such a way as to make the lens array movable in a direction approximately perpendicular to a traveling direction of the charged-particle beams;

a blanker array having a plurality of blankers which individually act on the plurality of charged-particle beams that pass;

a second stage arranged in such a way as to make the blanker array movable in a direction approximately perpendicular to the traveling direction of the charged-particle beams;

a shutter having an aperture capable of selectively passing the plurality of charged-particle beams;

a third stage arranged in such a way as to make the shutter movable in a direction approximately perpendicular to the traveling direction of the charged-particle beams; and control means which controls positions of the first stage, the second stage and the third stage, and a shape of the aperture of the shutter in such a way as to maximize the number of those charged-particle beams which pass properly functioning apertures of the aperture array, pass properly functioning lenses in the lens array, pass properly functioning blankers in the blanker array and pass the shutter.

When a charged-particle beam fails due to a failure in the associated multibeam forming device, the invention can execute an exposure process using only those beams having adequate properties without replacing the multibeam forming device and without degrading the exposure accuracy.

DETAILED DESCRIPTION OF THE PREFERRED EMBODIMENTS (First Embodiment)

Figure 2:
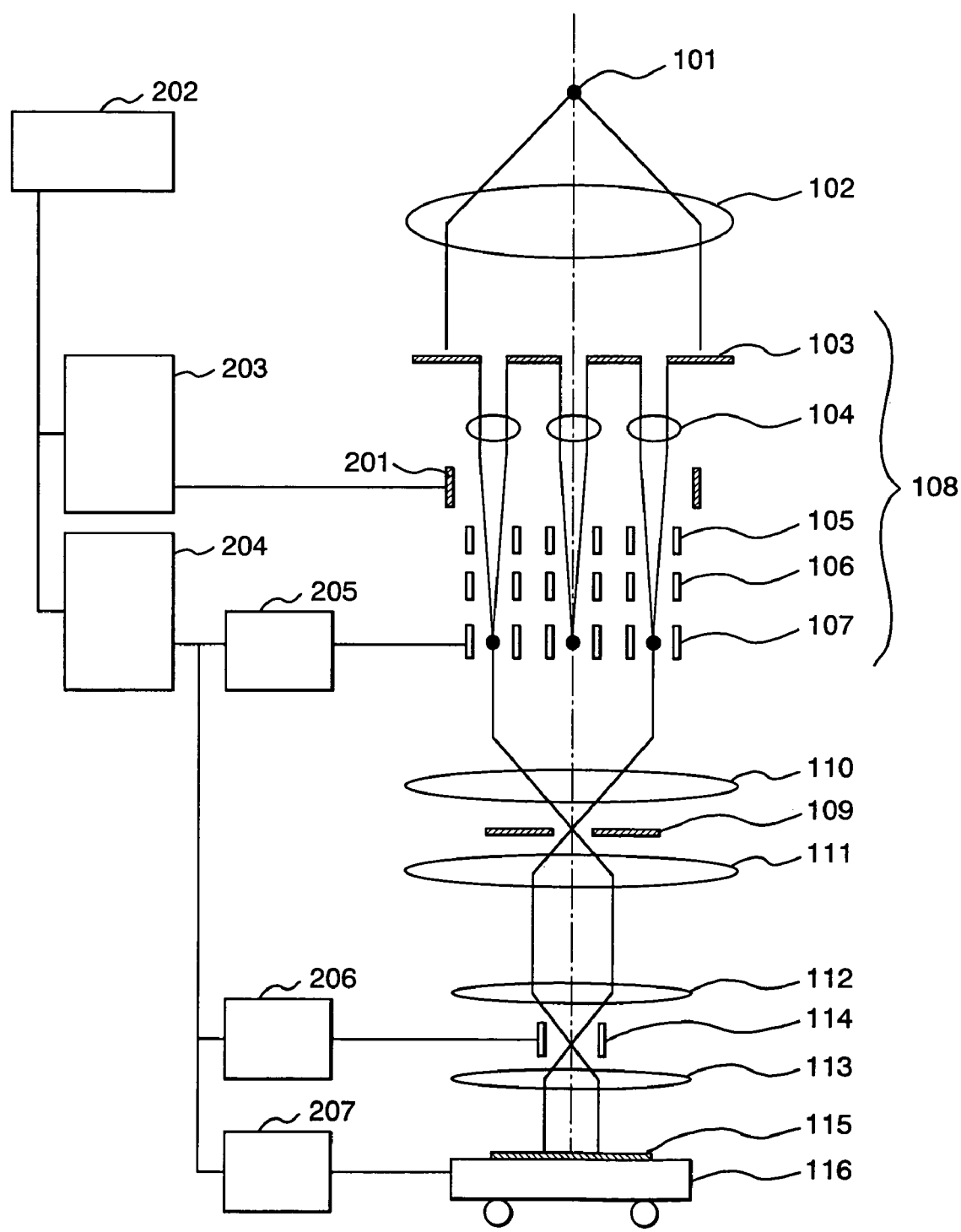
FIG. 2 is a structural diagram of a multibeam type electron beam exposure apparatus according to a first embodiment of the invention.

FIG. 2 shows the structure of a multibeam type electron beam exposure apparatus according to the first embodiment of the invention.

As mentioned earlier, such a multibeam system demands that irradiation and non-irradiation of all of a plurality of electron beams to be used for exposure onto a sample should be well controlled and the electron beams should be well converged at a desired position. A failure or so of a multibeam forming device may cause the following problems on an electron beam to be formed.

(1) A specific beam is unable to reach a sample.

This is a case, for example, where a foreign matter is adhered to the trajectory of an electron beam, or where the path of an electron beam is diverted by the disturbance of an electromagnetic field. At this time, an exposed pattern is partly dropped off or grazed.

(2) The property of a specific beam is degraded.

Figure 1:
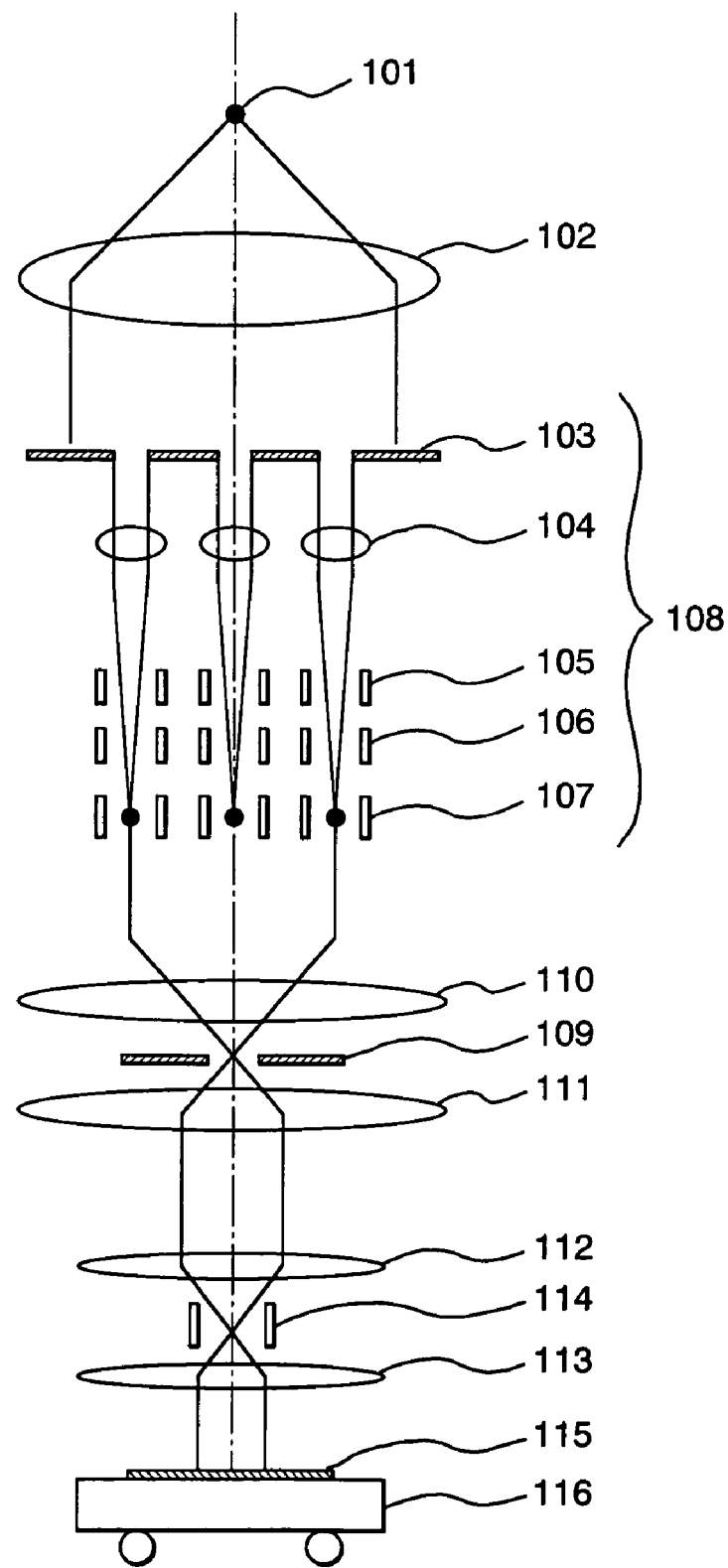
FIG. 1 is a structural diagram of a multibeam type electron beam exposure apparatus.

This is a case, for example, where of lenses constituting a lens array 104 in the multibeam type electron beam exposure apparatus in FIG. 1, a specific lens has an abnormal convergence due to adhesion of a foreign matter. This is another case where a specific electron beam dims or drifts due to charge-up near the beam trajectory. In such a case, the position accuracy or size accuracy of a part of an exposed pattern drops.

(3) A specific beam cannot be blocked to a sample.

This is a case, for example, where of blankers constituting a blanker array 107 in the multibeam type electron beam exposure apparatus in FIG. 1, a specific blanker has an open circuit and a voltage cannot be supplied to that blanker. This is another case where a specific blanker is short-circuited to the ground potential. In such a case, a beam is normally irradiated onto a sample so that an unnecessary pattern is exposed. Or, a drop in contrast reduces the size accuracy of a pattern.

In the cases (1) and (2), the embodiment continues exposure by taking the following scheme.

In the case (1), an exposure process is continued by providing a step of exposing a pixel which should be exposed by a beam unable to reach a sample, by using another beam. In the case (2), exposure is executed by always blocking a beam with a poor property to a sample regardless of pattern data in order not to irradiate the beam onto the sample. Then, the exposure process is continued by providing a step of exposing a pixel which should be exposed by using another beam with an adequate or good property, as done in the case (1).

In the case (3), however, the unableness of blocking an electron beam to the sample itself is the issue, the schemes for the cases (1) and (2) cannot be taken.

In the embodiment, therefore, a common blanker 201 which works on all of electron beams that are formed by multibeam forming devices is provided as shown in FIG. 2.

The common blanker 201, like an electromagnetic lens or aligner, is statically controlled by an optical device control circuit 203. A pattern control circuit 204 dynamically controls a blanker control circuit 205, a deflector control circuit 206 and a stage control circuit 207 to irradiate a beam based on pattern data onto a sample 115. The optical device control circuit 203 and the pattern control circuit 204 are controlled by a control computer 202 which is the interface to an operator.

The apparatus in FIG. 2 basically has a structure approximately similar to the structure of the multibeam type electron beam exposure apparatus shown in FIG. 1, except for the structure associated with the common blanker 201.

Referring now to FIGS. 3A to 3D, the action of the common blanker will be described while comparing a case where the common blanker is present and a case where the common blanker is not present.

Figure 3A:
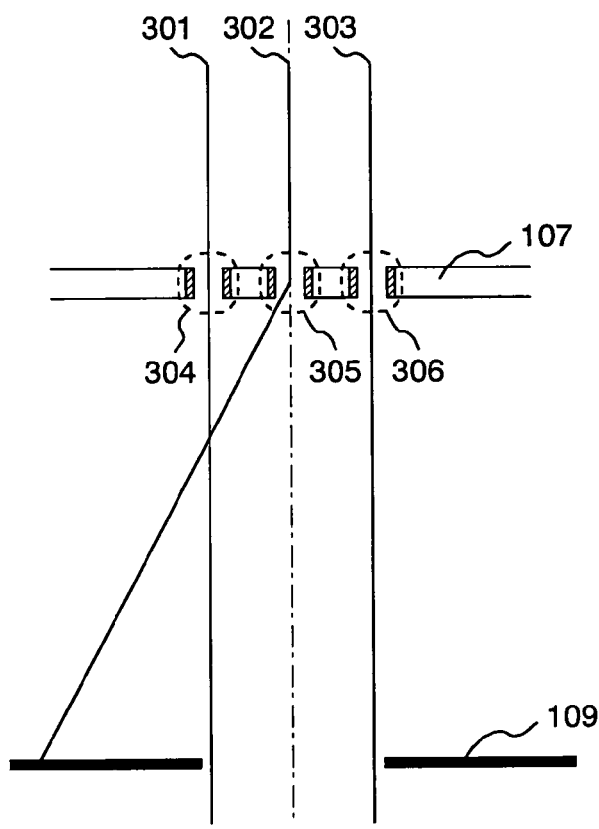
FIG. 3a is a diagram showing the relationship between beams and a blanking restriction according to the prior art.

FIG. 3a is an exemplary diagram showing the relationship among electron beams, a blanker array and a blanking restriction according to the prior art or when there is no common blanker. A blanker array 107 has a plurality of beam through holes formed in a silicon substrate and blankers 304, 305 and 306 associated with the holes. Each of the blankers 304, 305 and 306 is formed by two electrodes provided at the wall of the associated beam through hole. As a potential difference is given to the two electrodes, the blanker deflects an electron beam which passes.

In FIG. 3a, a beam 301 should be irradiated onto a sample. At this time, no voltage is applied to the blanker 304, and the beam 301 passes through a blanking restriction 109 and reaches the sample (not shown).

A beam 302 should not be irradiated onto a sample. At this time, a voltage is applied to the blanker 305 to divert the trajectory of the beam 302, so that the beam 302 is blocked by the blanking restriction 109 and does not reach the sample (not shown).

As the wire to apply a voltage to the blanker 306 has an open circuit, the trajectory of the beam 303 cannot be diverted using the blanker 306. Regardless of whether or not to irradiate the beam 303 onto the sample, therefore, the beam 303 passes the blanking restriction 109 and reaches the sample (not shown).

Figure 3B:
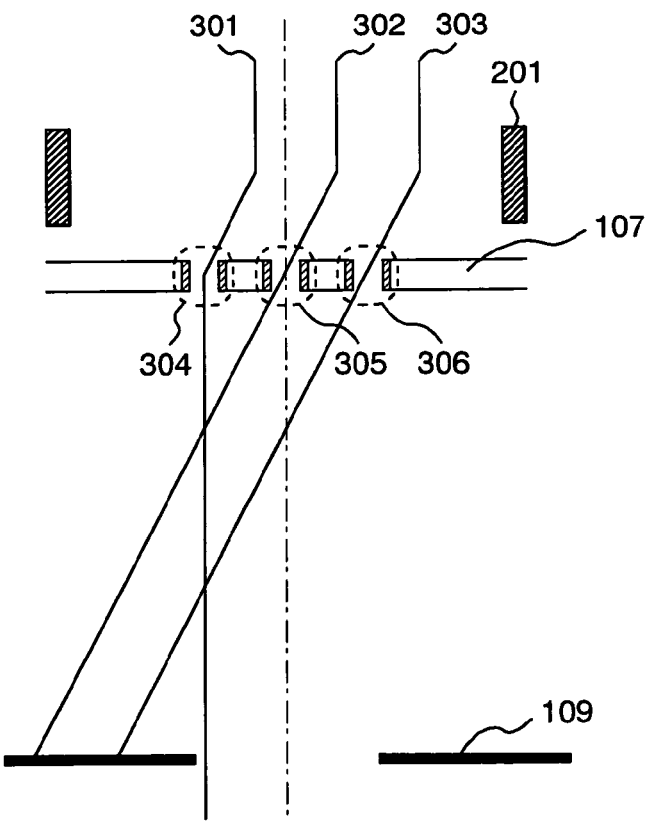
FIG. 3b is a diagram showing the relationship among beams, a common blanker and a blanking restriction according to the invention.

FIG. 3b is an exemplary diagram showing the relationship among electron beams, a blanker array and a blanking restriction according to the embodiment or when the common blanker 201 is present. In the diagram, the common blanker 201 diverts the trajectories of the beams 301, 302 and 303, allowing the beams to pass the blanker array 107.

The beam 301 should be irradiated onto a sample. At this time, a voltage is applied to the blanker 304 to deflect the beam 301 again, so that the beam 301 passes through the blanking restriction 109 in parallel to the beam axis (indicated by a one-dot chain line) and reaches the sample (not shown).

The beam 302 should not be irradiated onto a sample. At this time, no voltage is applied to the blanker 305, so that the beam 302 is blocked by the blanking restriction 109 without diverting the trajectory and does not reach the sample (not shown).

As the wire to apply a voltage to the blanker 306 has an open circuit, the trajectory of the beam 303 cannot be diverted using the blanker 306. Regardless of whether or not to irradiate the beam 303 onto the sample, therefore, the beam 303 is blocked by the blanking restriction 109 and does not reach the sample (not shown).

As apparent from the above, with the provision of the common blanker 201, the blanker array, which has conventionally worked to block individual beams to a sample when applied with a voltage, is provided with an operation of causing individual beams to reach a sample when a voltage is applied to the blanker array. Even in a case where a voltage to be applied to the electrodes of the blanker array becomes uncontrollable due to an open circuit or so, therefore, the possibility that a beam to a sample cannot be blocked is eliminated. Accordingly, the exposure process can be continued by providing a step of exposing a pixel which should be exposed by the beam by using another beam.

Figure 3C:
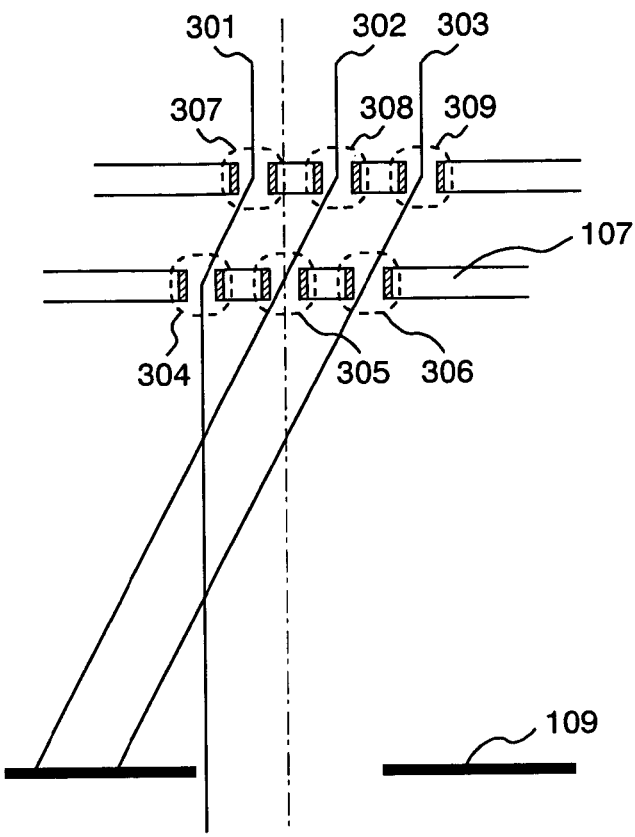
FIG. 3c is a diagram showing the relationship (1) among beams, a blanker array and the blanking restriction according to the invention.

To bring about a similar effect, two blanker arrays may be provided as shown in FIG. 3c.

The beam 301 should be irradiated onto a sample. At this time, voltages of the opposite polarities are applied to the blanker 304 and a blanker 307, so that the beam 301 passes through the blanking restriction 109 in parallel to the beam axis (indicated by a one-dot chain line) and reaches the sample (not shown).

The beam 302 should not be irradiated onto a sample. At this time, a voltage is applied only to the blanker 305 and no voltage is applied to a blanker 308. Therefore, the beam 302 is blocked by the blanking restriction 109 and does not reach the sample (not shown).

As the wire to apply a voltage to a blanker 309 has an open circuit, the trajectory of the beam 303 cannot be diverted using the blanker 309. Irrespective of whether or not to irradiate the beam 303 onto the sample, therefore, the beam 303 is blocked by the blanking restriction 109 and does not reach the sample (not shown). Likewise, the trajectory of the beam to the sample is blocked by the blanking restriction 109 when the wire to apply a voltage to the blanker 306 has an open circuit and the wire to apply a voltage to the blanker 309 has no open circuit, and when the wires to apply voltages to both the blankers 306 and 309 have an open circuit.

Figure 3D:
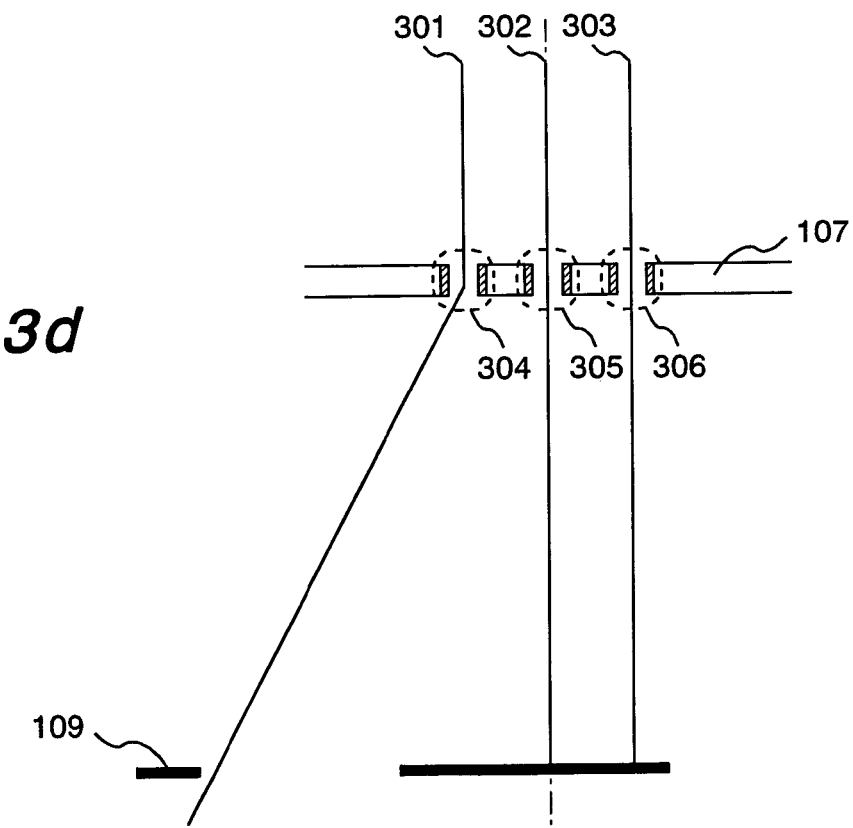
FIG. 3d is a diagram showing the relationship (2) among beams, the blanker array and the blanking restriction according to the invention.

To provide a similar effect, the blanking restriction 109 may be laid out eccentric to the beam axis (indicated by a one-dot chain line) as shown in FIG. 3d.

The beam 301 should be irradiated onto a sample. At this time, a voltage is applied to the blanker 304 to deflect the beam 301, so that the beam 301 passes through the blanking restriction 109 and reaches the sample (not shown).

The beam 302 should not be irradiated onto a sample. At this time, no voltage is applied to the blanker 305, so that the beam 302 is blocked by the blanking restriction 109 without diverting the trajectory and does not reach the sample (not shown).

As the wire to apply a voltage to the blanker 306 has an open circuit, the trajectory of the beam 303 cannot be diverted using the blanker 306. Regardless of whether or not to irradiate the beam 303 onto the sample, therefore, the beam 303 is blocked by the blanking restriction 109 and does not reach the sample (not shown).

As the beam that has passed the blanking restriction 109 has an angle to the beam axis (indicated by the one-dot chain line) according to the method, this point should be considered in designing the optical system at the downstream.

Figure 4:
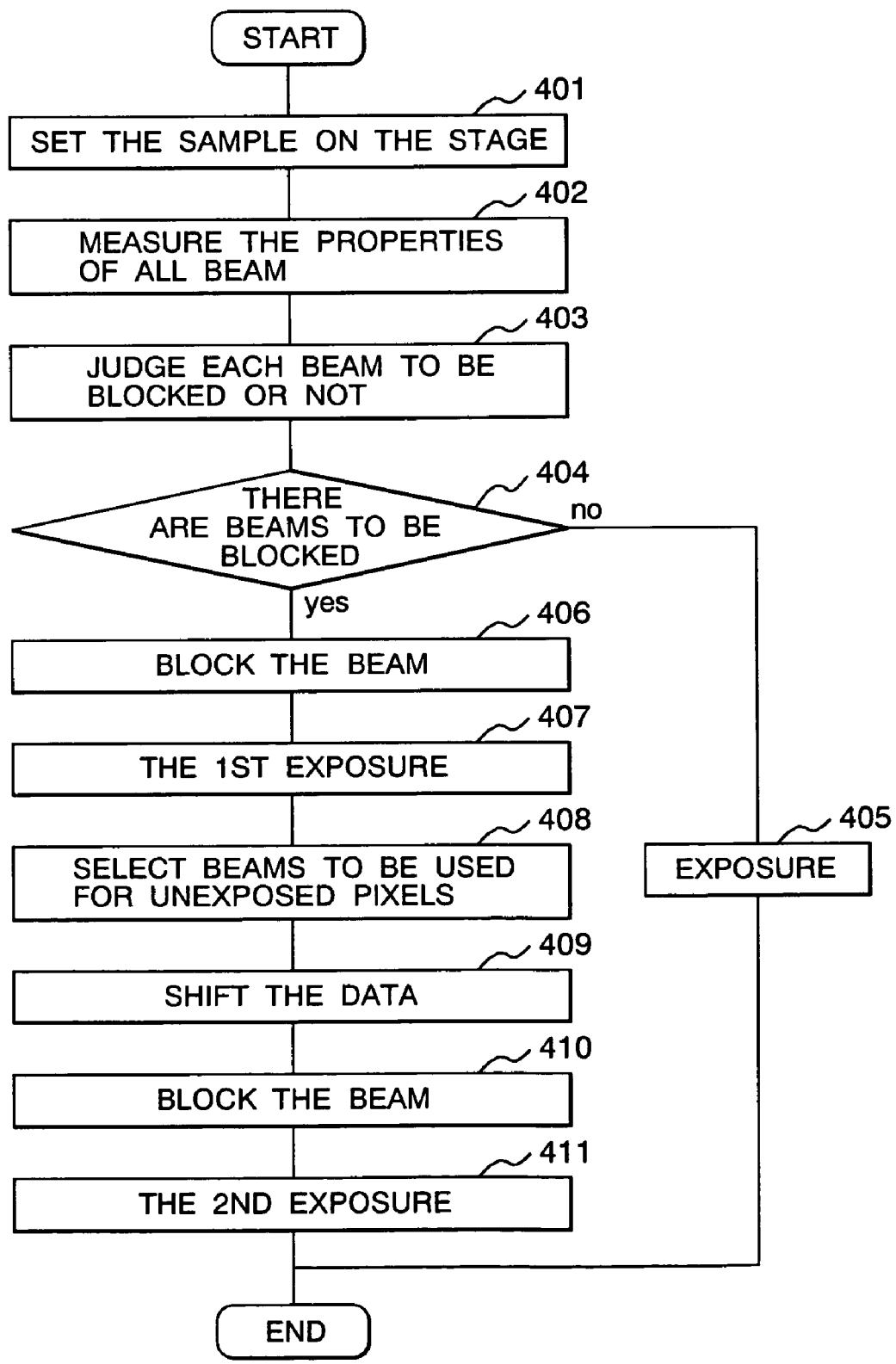
FIG. 4 is a flowchart for explaining an exposure method according to the first embodiment.

Referring to a flowchart illustrated in FIG. 4, the exposure procedures according to the embodiment will be described below.

After a sample is set on a stage (step 401), the properties of all the beams to be used for exposure are measured (step 402). The "properties" include the following:

(1) Blanking controllability. A change in current when a voltage is applied to each blanker is measured by a detector, such as a Faraday cup or a semiconductor detector placed on the stage.

(2) Beam current (3) Beam shape (4) Beam position

Based on the results of measuring one property or more of the four properties, including a change with time, it is decided whether to block or not on all of the beams (step 403).

FIG. 5 shows multiple beams arranged two-dimensionally (e.g., 16×16). In the embodiment, only those beams which have been decided to be defective as marked by "X" in FIG. 5a are blocked to the sample.

At step 404, it is decided whether or not there are beams to be blocked. When it is decided that there are no beams to be blocked, the individual beams are controlled based on pattern data to carry out exposure as per the prior art (step 405).

Figure 5A:
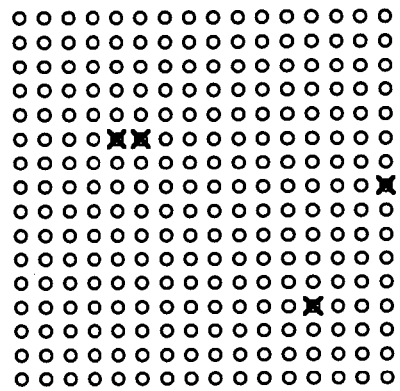
FIGS. 5a to 5e are diagrams showing the states of individual beams according to the first embodiment.
Figure 5B:
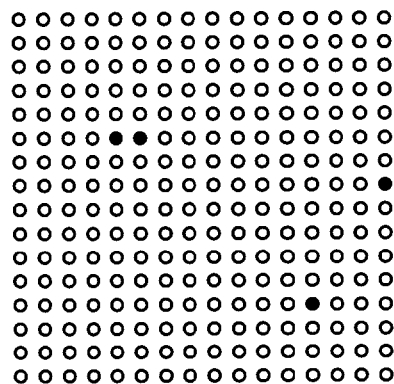

When it is decided that there are some beams to be blocked, the beams are blocked according to the decision made at step 403 (step 406). As only those beams with inadequate or bad properties are blocked to the sample in the embodiment, the states of the individual beams become as shown in FIG. 5b, indicating beams to be irradiated onto the sample by white circles (mark 0) and beams not to be irradiated by black circles (mark □). According to the embodiment, as has already been described, the action of the common blanker blocks a beam to the sample when no voltage is applied to the associated blanker in the blanker array, and allows a beam to reach the sample when a voltage is applied to the associated blanker. Specifically, no voltage should be applied to those blankers which correspond to the black circles in FIG. 5B, regardless of pattern data to be exposed, while a voltage should be applied to those blankers which correspond to the white circles according to the pattern data to be exposed.

Then, the first exposure is executed (step 407). In the exposure, those beams which have been decided not to be blocked to the sample (indicated by white circles in FIG. 5*b*) are controlled in the same way as done in the exposure step for the case where it is decided that there are no beams to be blocked (step 405).

After step 407, those pixels which should originally be exposed by the beams that are blocked regardless of pattern data are not in the first exposure. At step 408, substitute beams for irradiating the unexposed pixels are decided.

When all the beams adjacent to that beam which is blocked in the first exposure have good properties, the adjacent beams should be used. In the embodiment, as adjoining two beams both have bad properties as shown in FIG. 5*a*, the third adjoining beam skipping the two defective beams is used to irradiate the associated unexposed pixel. Of course, any shifting can be taken if every pixel which could not been exposed in the first exposure can be exposed.

At step 409, data is shifted according to the decision made at step 408. To irradiate an adjoining beam onto an unirradiated pixel, exposure should be executed by shifting pattern data by one beam. In case where the third adjoining beam skipping the two defective beams is used as in the embodiment, the pattern data should be shifted by two beams.

Figure 5C:
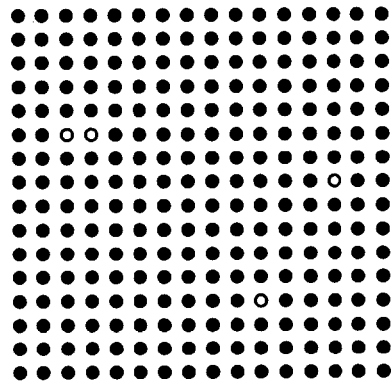

At step 410, those beams which are not used are blocked according to the decision made at step 408. The beam states become as shown in FIG. 5*c* in the embodiment, indicating beams to be irradiated onto the sample by white circles and beams not to be irradiated by black circles.

At step 411, the second exposure is executed. Accordingly, those pixels which could not be irradiated with beams at step 407 can be exposed using beams with good properties.

As the exposure process is performed in the procedures, exposure can be done using only good electron beams even when some electron beams fail.

Although defective beams are blocked to the sample after which the first exposure is executed, then those pixels which should originally be exposed by the blocked beams are exposed by using proper or good beams in the embodiment, the effect does not change if the order of the procedures is reversed.

Figure 5D:
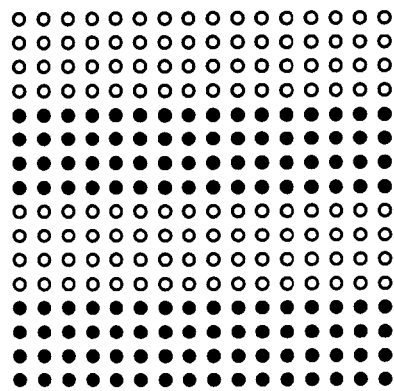
Figure 5E:
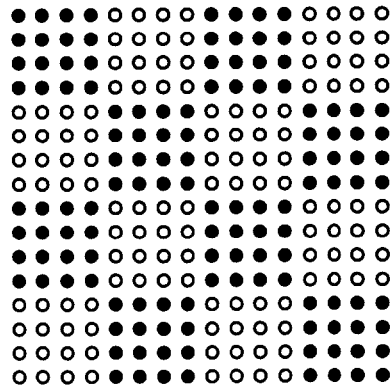

Only defective beams are blocked to the sample in the embodiment. From the viewpoint of suppressing the Coulomb's effect, however, it is desirable that the number of beams that reach the sample simultaneously should be as even as possible in terms of time. If beams are blocked in a stripe pattern as shown in FIG. 5*d* or in a checkered pattern as shown in FIG. 5*e*, the number of beams that reach the sample simultaneously can be made even in terms of time. Even in this case, the effect of the embodiment does not change as long as all defective beams can be blocked.

(Second Embodiment)

The second embodiment of the invention blocks defective electron beams to a sample and performs an exposure process by using only good beams without changing the mode of the multibeam type electron beam exposure apparatus shown in FIG. 1, while coping with bad properties of beams originated from failures or so in multibeam forming devices like those which are handled in the first embodiment.

In the embodiment, deflector arrays 105 and 106 in FIG. 1 are used to block beams with bad properties. As described in the "BACKGROUND OF THE INVENTION", the deflector array should originally work to deflect passing electron beams to individually adjust the positions of intermediate images of electron sources formed on the blanker array 107 in a plane orthogonal to the optical axis. In the embodiment, however, when a failure occurs in the blanker array and a specific electron beam cannot be blocked to a sample, the deflector array is used as a blanker the blanker array is used as a blanking restriction.

Referring to FIG. 6, a description will now be given of the conventional way of using the deflector array and the method of substituting the deflector array for a blanker as done in the embodiment.

Figure 6A:
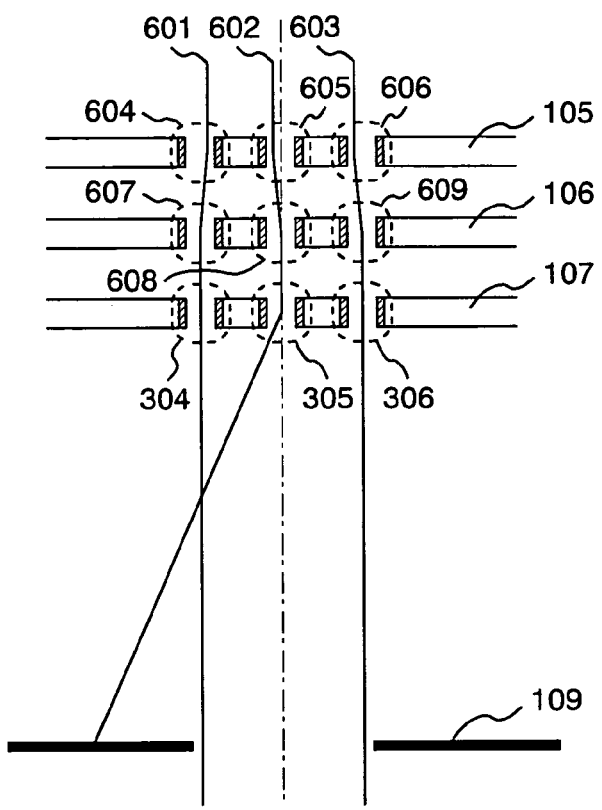
FIG. 6a is a diagram showing the relationship (1) among beams, blankers, a blanking restriction and a deflector array according to the invention.

FIG. 6*a* is a diagram for explaining a case where a failure occurs in the blanker array.

A beam 601 is adjusted by deflectors 604 and 607 in those deflectors which constitute the deflector arrays 105 and 106, and passes at a desired position over the blanker 304 at a desired angle. As the beam 601 should be irradiated onto the sample, no voltage is applied to the blanker 304 and the beam 601 passes the blanking restriction 109 and reaches the sample (not shown).

A beam 602 is adjusted by deflectors 605 and 608 in those deflectors which constitute the deflector arrays 105 and 106, and passes at a desired position over the blanker 305 at a desired angle. As the beam 602 should not be irradiated onto the sample, no voltage is applied to the blanker 305 and the beam 602 is blocked by the blanking restriction 109 and does not reach the sample (not shown).

A beam 603 is adjusted by deflectors 606 and 609 in those deflectors which constitute the deflector arrays 105 and 106, and passes at a desired position over the blanker 306 at a desired angle. As the wire to apply a voltage to the blanker 306 has an open circuit, the trajectory of the beam 603 cannot be diverted using the blanker 306. Regardless of whether the beam 603 should originally be irradiated onto the sample or not, therefore, the beam 603 passes the blanking restriction 109 and reaches the sample (not shown).

Figure 6B:
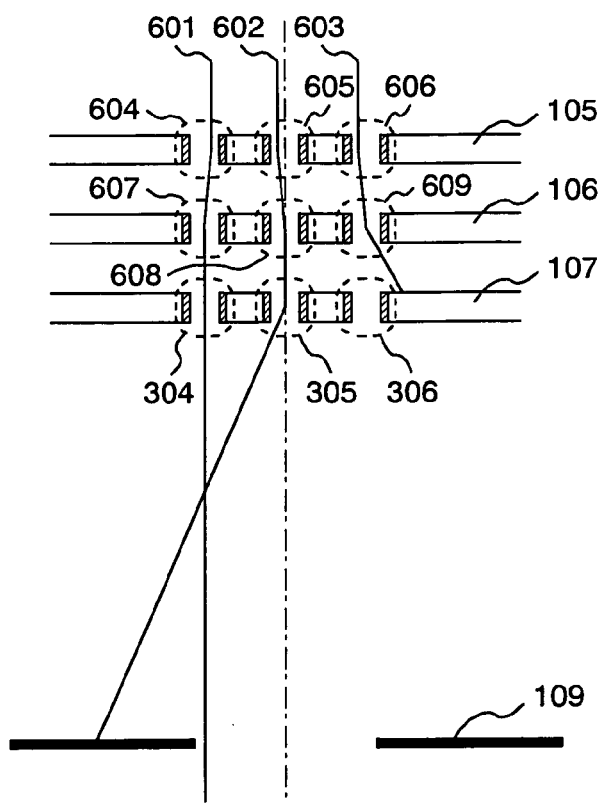
FIG. 6b is a diagram showing the relationship (2) among beams, blankers, a blanking restriction and a deflector array according to the invention.

FIG. 6*b* is a diagram for explaining the embodiment.

The beam 603 is deflected by deflectors 606 and 609 in those deflectors which constitute the deflector arrays 105 and 106, and is blocked to the sample by the blanker array 107. That is, substituting the deflector array for a blanker and substituting the blanker array for a blanking restriction eliminates a possibility of disabling blocking of a beam to the sample even when a voltage to be applied to the electrodes of the blanker array becomes uncontrollable due to the presence of an open circuit or so. Therefore, the exposure process can be continued by providing a step of exposing a pixel which should be exposed by the blocked beam by using another beam in a method similar to the method of the first embodiment.

Figure 6C:
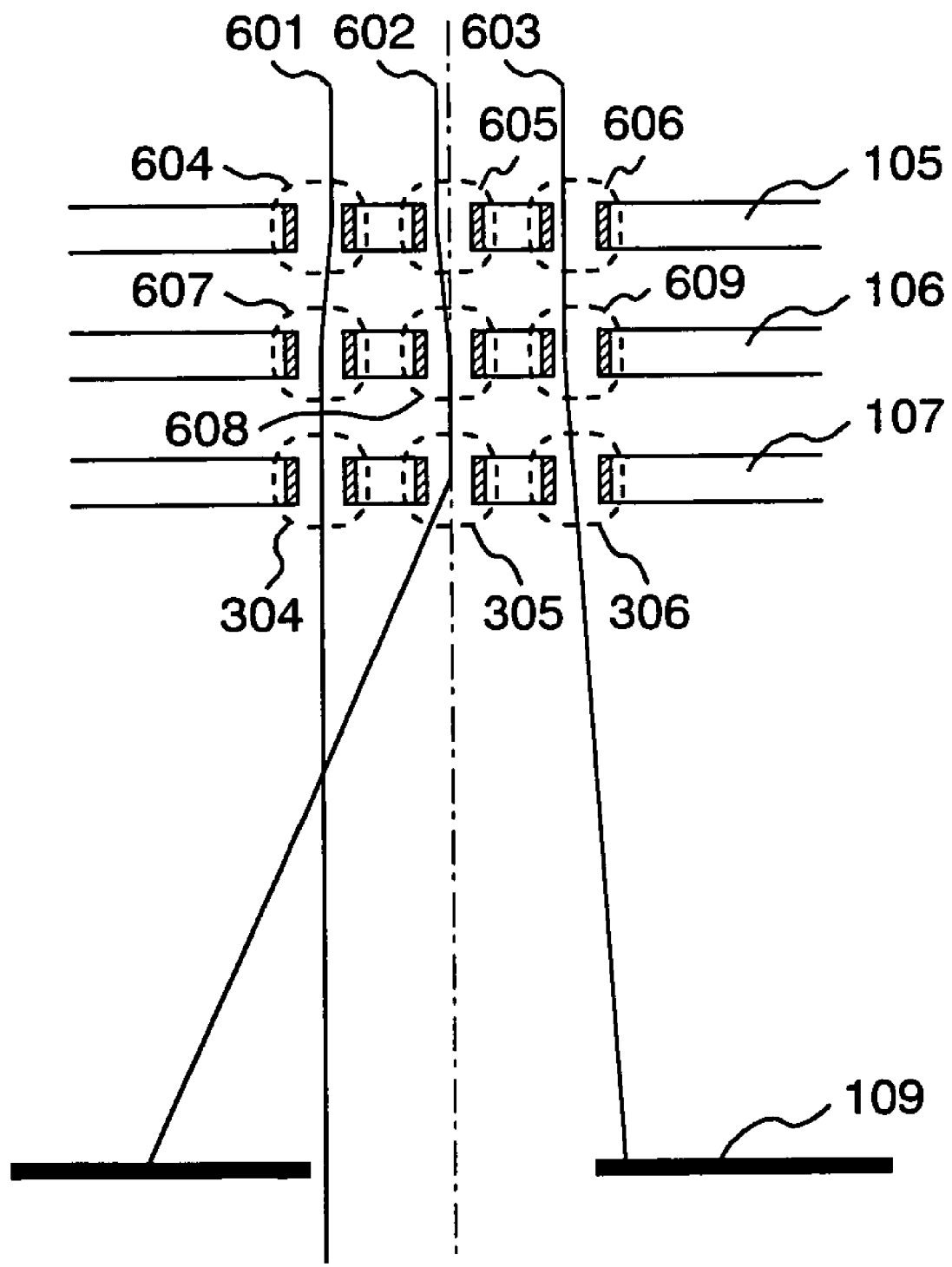
FIG. 6c is a diagram showing the relationship (3) among beams, blankers, a blanking restriction and a deflector array according to the invention.

A similar effect can be acquired by substituting the deflector array for a blanker and blocking a bad beam to the sample by the blanking restriction as shown in FIG. 6*c*.

(Third Embodiment)

Figure 7:
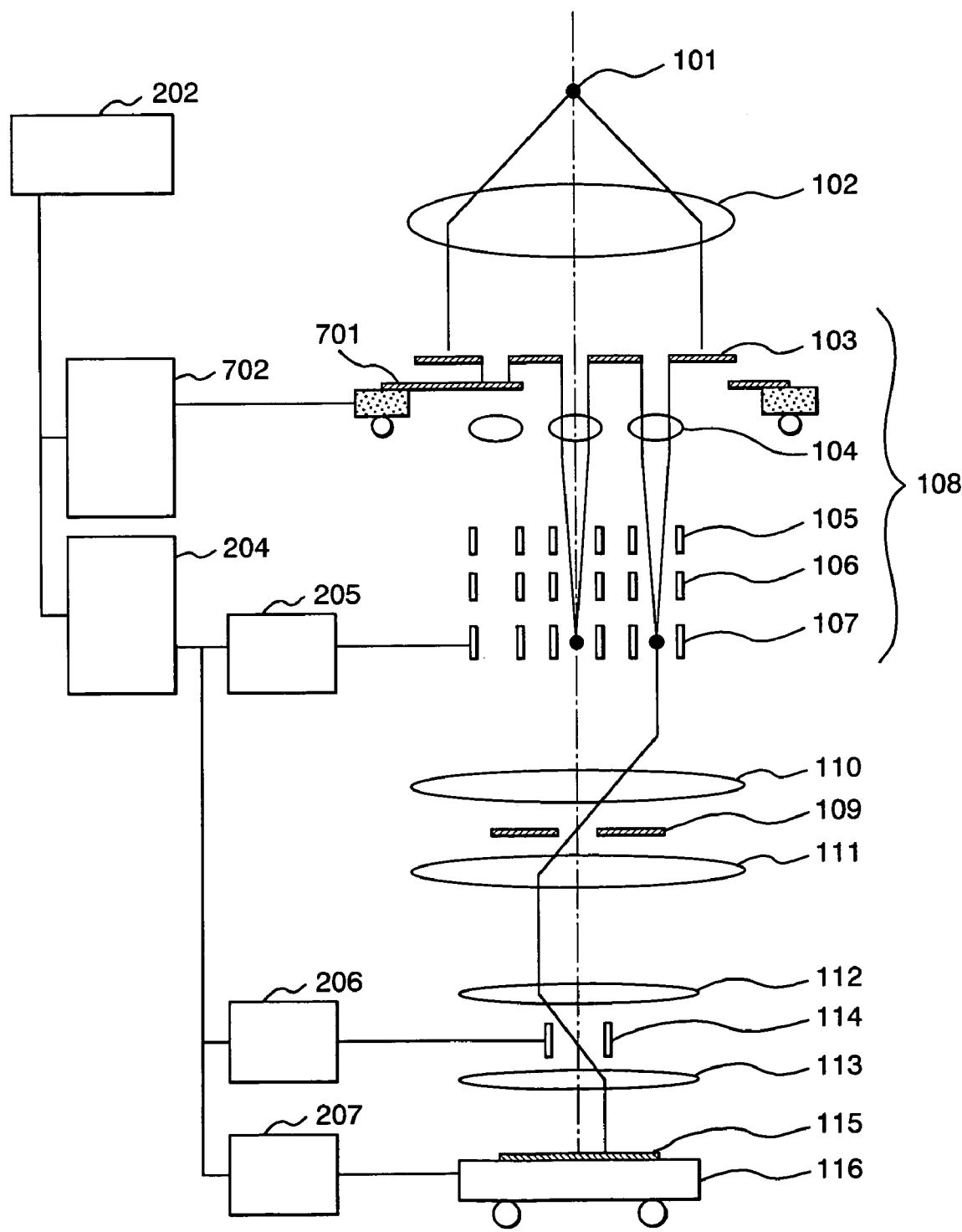
FIG. 7 is a structural diagram of a multibeam type electron beam exposure apparatus according to a third embodiment of the invention.
Figure 8A:
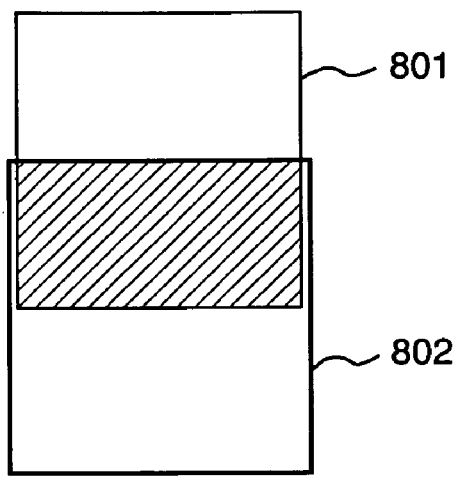
FIGS. 8a to 8d are diagrams for explaining how to extract a beam according to the third embodiment.
Figure 8B:
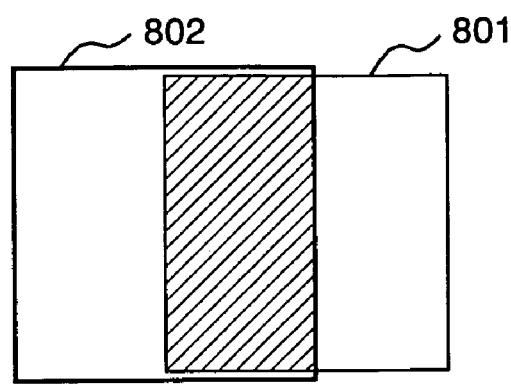
Figure 8C:
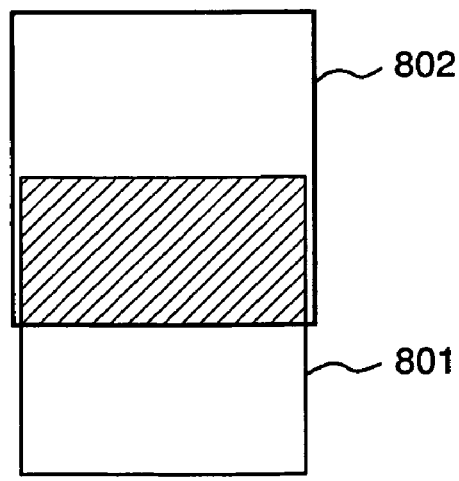
Figure 8D:
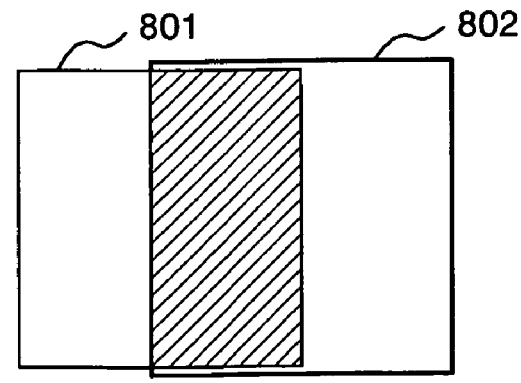

FIG. 7 shows the structure of a multibeam type electron beam exposure apparatus according to the third embodiment of the invention.

In the embodiment, a movable shutter 701 is provided on the beam trajectory, specifically, between the aperture array 103 and the lens array 104. The aperture of the movable shutter 701 has an approximately square shape large enough to be able to pass all of M×N beams split by the aperture array 103 at the height (z) of the movable shutter 701. With the z direction being the beam traveling direction, the movable shutter 701 can move within a plane approximately perpendicular to the z direction.

Adjusting the position of the movable shutter 701 within the xy plane can allow some (m×n) or all of the beams split by the aperture array 103 to reach the sample and block the remaining beams. That is, it is possible to block beams with bad properties and extract only beams with good properties.

The performance that is demanded in moving the movable shutter 701 is the position accuracy as high as the interval between beams discretely split by the aperture array 103. Because of the purpose of keeping blocking a specific beam during exposure, the movable shutter 701 is not required to move fast. Therefore, the movable shutter 701 is statically controlled by a shutter control circuit 702. The pattern control circuit 204 irradiates beams based on pattern data onto the sample by dynamically controlling the blanker control circuit 205, the deflector control circuit 206 and the stage control circuit 207. The shutter control circuit 702 and the pattern control circuit 204 are controlled by the control computer 202 which is the interface to an operator.

In FIG. 8, reference symbol "801" denotes beams split by the aperture array 103 and reference symbol "802" denotes the aperture of the movable shutter 701. In the embodiment, half of the beams formed by the aperture array 103 which are indicated by hatches are allowed to pass the aperture of the movable shutter 701 to be used for exposure, while the remaining half are blocked by the movable shutter 701. Specifically, provided that the beams formed by the aperture array 103 are separated into first to fourth quadrant regions, there are four relationships between the movable shutter 701 and the beams formed by the aperture array 103: the third and fourth quadrants of beams 801 are passed as shown in FIG. 8a, the second and third quadrants of the beams 801 are passed as shown in FIG. 8b, the first and third quadrants of the beams 801 are passed as shown in FIG. 8c, and the fourth and first quadrants of the beams 801 are passed as shown in FIG. 8d.

Prior to the description of the exposure system according to the embodiment, the conventionally proposed multibeam exposure system will be described referring to FIGS. 1 and 9.

The individual blankers constituting the blanker array 107 control voltages to be applied to the individual beams split by the aperture array 103 to thereby control irradiation or non-irradiation of the associated electron beams to the sample. As the stage 116 on which the sample 115 is set is continuously moving in the y direction at this time, the deflector 114 deflects a plurality of electron beams to be irradiated onto the sample 115 and make the electron beams follow up the movement of the stage 116. The continuous deflecting operation causes the individual electron beams to expose a pattern in associated elements of field on the sample 115 as shown in FIG. 9. As the number of electron beams to be used in exposure is 16×16 in the embodiment, a pattern is exposed in 16×16 elements of field assigned to the individual beams at a time. This field consisting of 16×16 elements of field is defined as a sub-field. After a pattern is exposed in one sub-field (SF1), the deflector deflects a plurality of electron beams in the direction (x direction) orthogonal to the direction of the continuous movement of the stage (y direction) to expose a pattern in a next sub-field (SF2). As patterns are exposed one after another in the sub-fields arranged in the direction (x direction) orthogonal to the direction of the continuous movement of the stage (y direction) as shown in FIG. 9, a pattern is exposed in one main-field (MF1) comprised of sub-fields.

The deflector 114 scans the main-fields (MF2, MF3, . . . ) laid out in the direction of the continuous movement of the stage 116 with beams, thereby exposing a pattern in a stripe (STRIPE1) comprised of the main-fields. The width of the stripe is determined by the size of the sub-fields and the amount of deflection and is called a stripe width. Then, the stage 116 is moved in the x direction and a pattern is exposed in a next stripe (STRIPE2).

The multibeam exposure system conventionally proposed is constructed on the premise that all of the beams split by the aperture array 103 are controlled properly. By way of comparison, the embodiment handles a case where a specific beam in the beams split by the aperture array 103 becomes uncontrollable.

Figure 10:
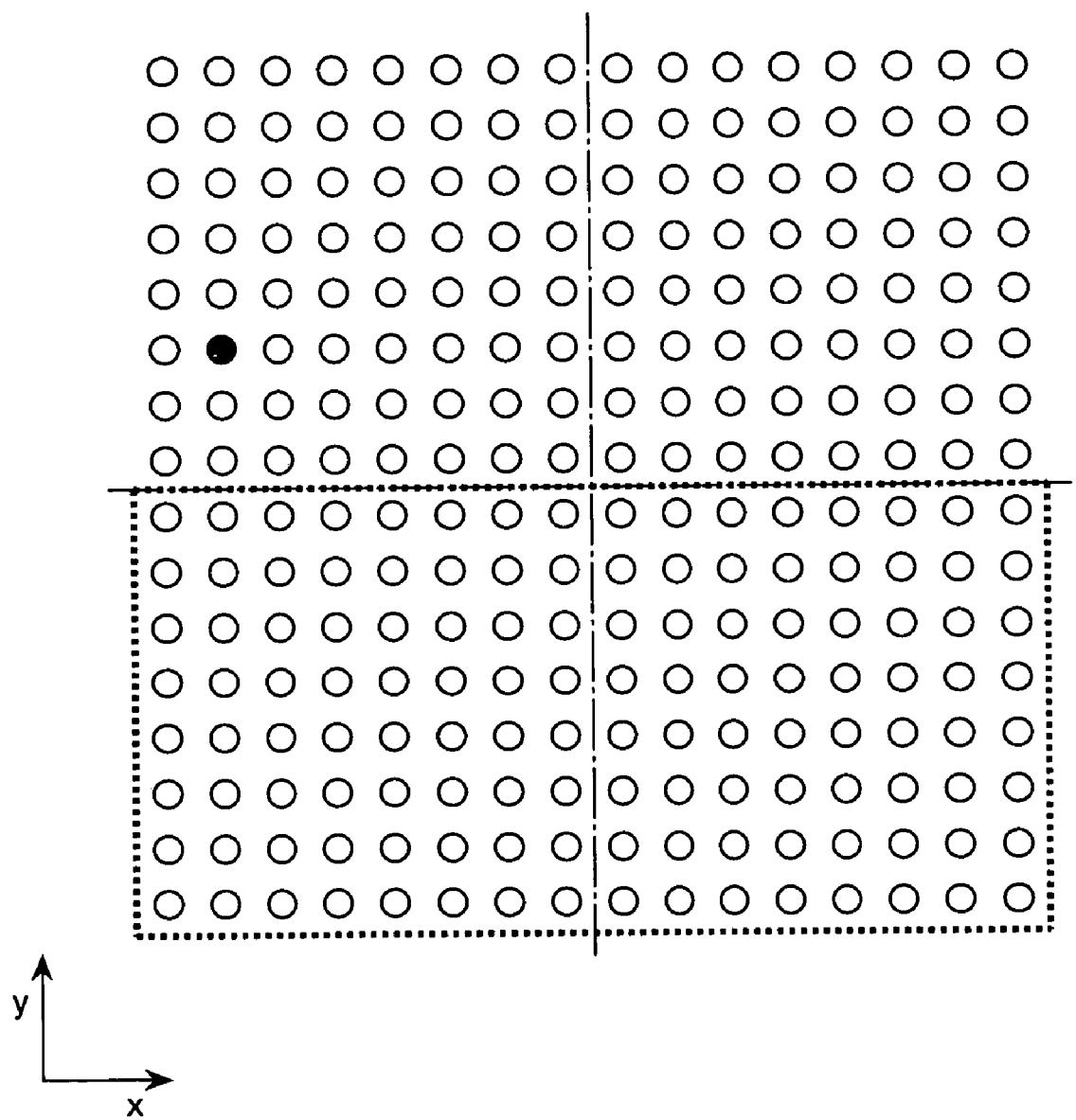
FIG. 10 is a diagram showing the states of individual beams according to the third embodiment.

In FIG. 10, for example, white circles (○) indicates beams with good properties and black circles (□) indicates beams with bad properties. When such a fault occurs, good half of the beams are extracted by the movable shutter 701 and used in exposure. That is, the upper half (the first and second quadrants) are blocked, and exposure is carried out using only the lower half (the third and fourth quadrants) indicated by the broken line in the diagram. Alternatively, the left half (the second and third quadrants) may be blocked, and exposure may be carried out using only the right half (the fourth and first quadrants) indicated by the broken line in the diagram.

Figure 11A:
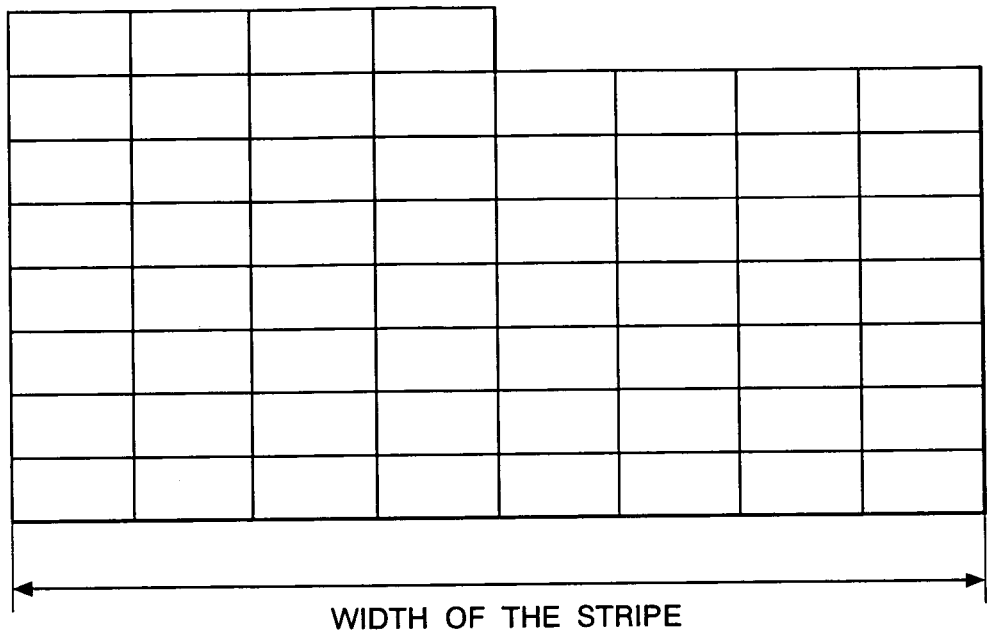
FIGS. 11a and 11b are diagrams showing the relationship between a stripe and a sub-field according to the third embodiment.
Figure 11B:
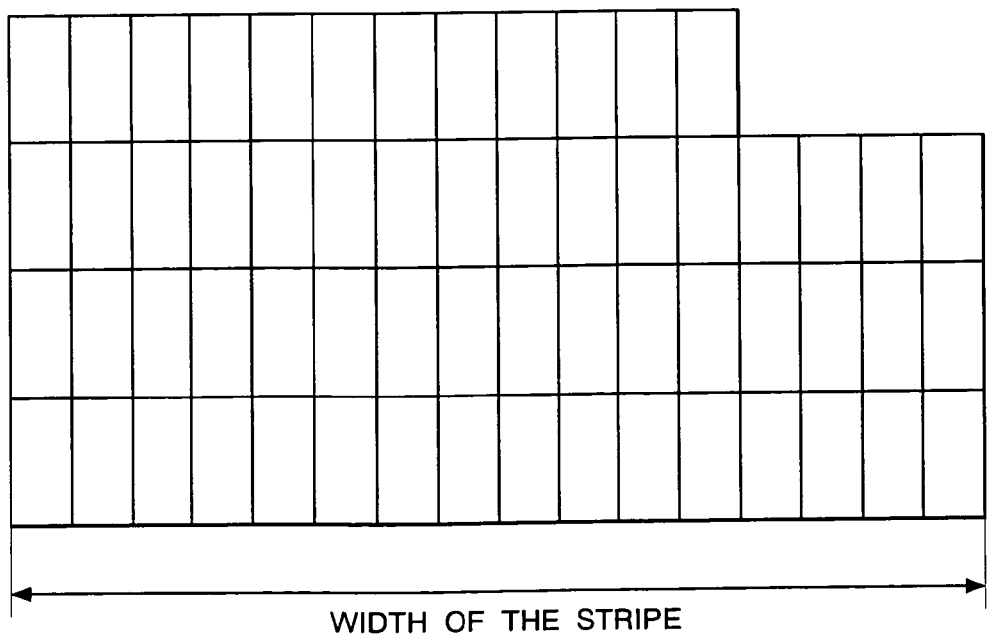

When such beam extraction is performed, the regions to be exposed at a time change according to the numbers of rows and columns of extracted beams, and are redefined as sub-fields. That is, when beams in the upper half (the first and second quadrants) and the lower half (the third and fourth quadrants) are extracted, one side of a sub-field in the y direction becomes half the length in the prior art, as shown in FIG. 11a. Accordingly, one side of a main-field in the y direction also becomes half the length in the prior art as shown in FIG. 11a. When the left half (the second and third quadrants) and the right half (the fourth and first quadrants) are extracted, one side of a sub-field in the x direction becomes half the length in the prior art, as shown in FIG. 11b. In this case, one side of a main-field in the x direction may be made a half, but the throughput can be kept higher by performing an exposure process under the condition that the number of sub-fields constituting a main-field is increased, and both sides of each main-field are set to the same lengths in the x and y directions as those in the prior art.

Figure 12:
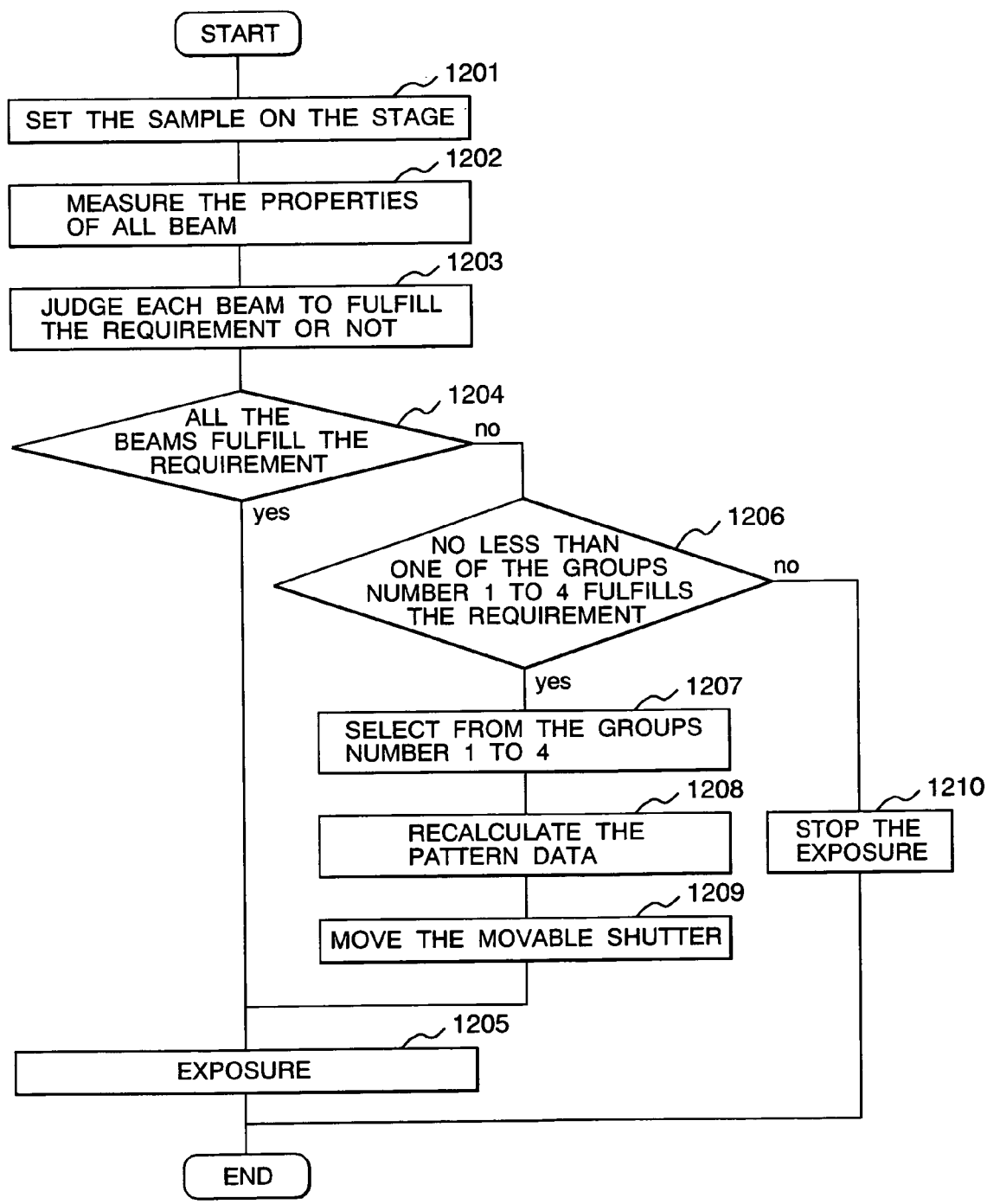
FIG. 12 is a flowchart for explaining an exposure method according to the third embodiment.

Referring to a flowchart illustrated in FIG. 12, the exposure procedures according to the embodiment will be described below:

After a sample is set on a stage (step 1201), the properties of all the beams to be used for exposure are measured (step 1202). The properties include the blanking property, the beam current and the beam shape. According to the result of measuring the beam properties, it is decided whether the requirement to achieve irradiation on the sample is fulfilled or not on all the beams (step 1203).

At step 1204, it is decided whether all the beams fulfill the requirement. When it is decided that all the beams fulfill the requirement, the individual beams are controlled based on the pattern data for exposure as done in the prior art (step 1205).

When it is decided that there is at least one beam which does not fulfill the requirement, it is decided at step 1206 whether exposure with the extracted beams is possible or not. That is, given that the upper half (the first and second quadrants) of the beams extracted by the aperture array 103 is defined as a first group, the lower half (the third and fourth quadrants) is defined as a second group, left half (the second and third quadrants) is defined as a third group, and the right half (the fourth and first quadrants) is defined as a fourth group, it is decided whether or not there is any beam group in the first group to the fourth group whose component beams all fulfill the requirement for irradiation onto the sample. In other words, it is decided whether or not there is any beam group which can be used in exposure.

When it is decided that there is a beam group which can be used in exposure at step 1206, it is decided which one of the first group to the fourth group should be used in exposure at step 1207. As beams with good properties are distributed only in the second quadrant in the embodiment, exposure is executed using the second group. Exposure may be executed using the fourth group.

According to the decision at step 1207, pattern data is recomputed as follows (step 1208).

First, the sizes of the sub-field, the main-field and the stripe are decided from the numbers of rows and columns of extracted beams. Then, pattern data is finally separated into units of elements of field corresponding to the respective beams split by the aperture array 103.

Next, according to the decision made at 1207, the movable shutter is moved (step 1209), and exposure is executed (step 1205).

When it is decided that there is no beam group which can be used in exposure at step 1206, it is decided to stop exposure (step 1210) and a pattern is displayed on the screen or so for a user.

As the exposure process is carried out in the above-described procedures, exposure can be executed using only good beams even when an electron beam fails due to a failure in the associated multibeam forming device. The time needed for beam irradiation is twice the time needed when there are no bad beams.

In the embodiment, the movable shutter 701 is provided between the aperture array 103 and the lens array 104. This is because it is not only the height (z) at which beams split by the aperture array 103 are not merged with one another, but also the position where provision of the movable shutter 701 is relatively easy. In the principle, a similar effect is obtained when the movable shutter 701 is set at any height as long as it is the height (z) at which beams split by the aperture array 103 are not merged with one another.

(Fourth Embodiment)

In the fourth embodiment, the third embodiment is applied to making the drop of the throughput originated from a failure in a multibeam forming device as small as possible.

In the embodiment, as in the third embodiment, the movable shutter 701 extracts a beam group comprised of those in the beams split by the aperture array with good properties. It is to be noted however that in half of the upper and lower beam groups or the right and left beam groups of the beams formed by the aperture array 103 are extracted the third embodiment, whereas the numbers of rows and columns of beams to be extracted by the movable shutter are given the degree of freedom in the fourth embodiment. Specifically, the numbers of rows and columns of beams to be extracted by a movable shutter 1302 are made variable by adjusting the relative positions of beams 1301 formed by the aperture array and the movable shutter 1302, as shown in FIGS. 13a, 13b, 13c and 13d. To know the number of beams that are blocked, the current flowing in the movable shutter should be measured.

Figure 14A:
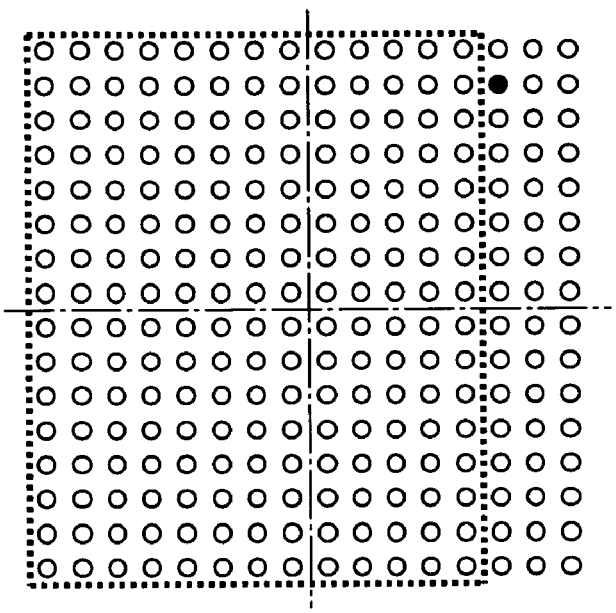
FIGS. 14a and 14b are diagrams showing the states of individual beams according to the fourth embodiment.

In FIG. 14a, white circles (o) indicates beams with good properties and black circles (□) indicates beams with bad properties. When beams are extracted as indicated by the broken line in FIG. 14a, for example, beams greater in number by five columns, i.e., 63% in the ratio, than that in case where only half of the entire beams are extracted as in the third embodiment. Data control becomes simpler if a restriction such as making the numbers of rows and columns of beams to be extracted an even number or a multiplication of four.

Figure 9:
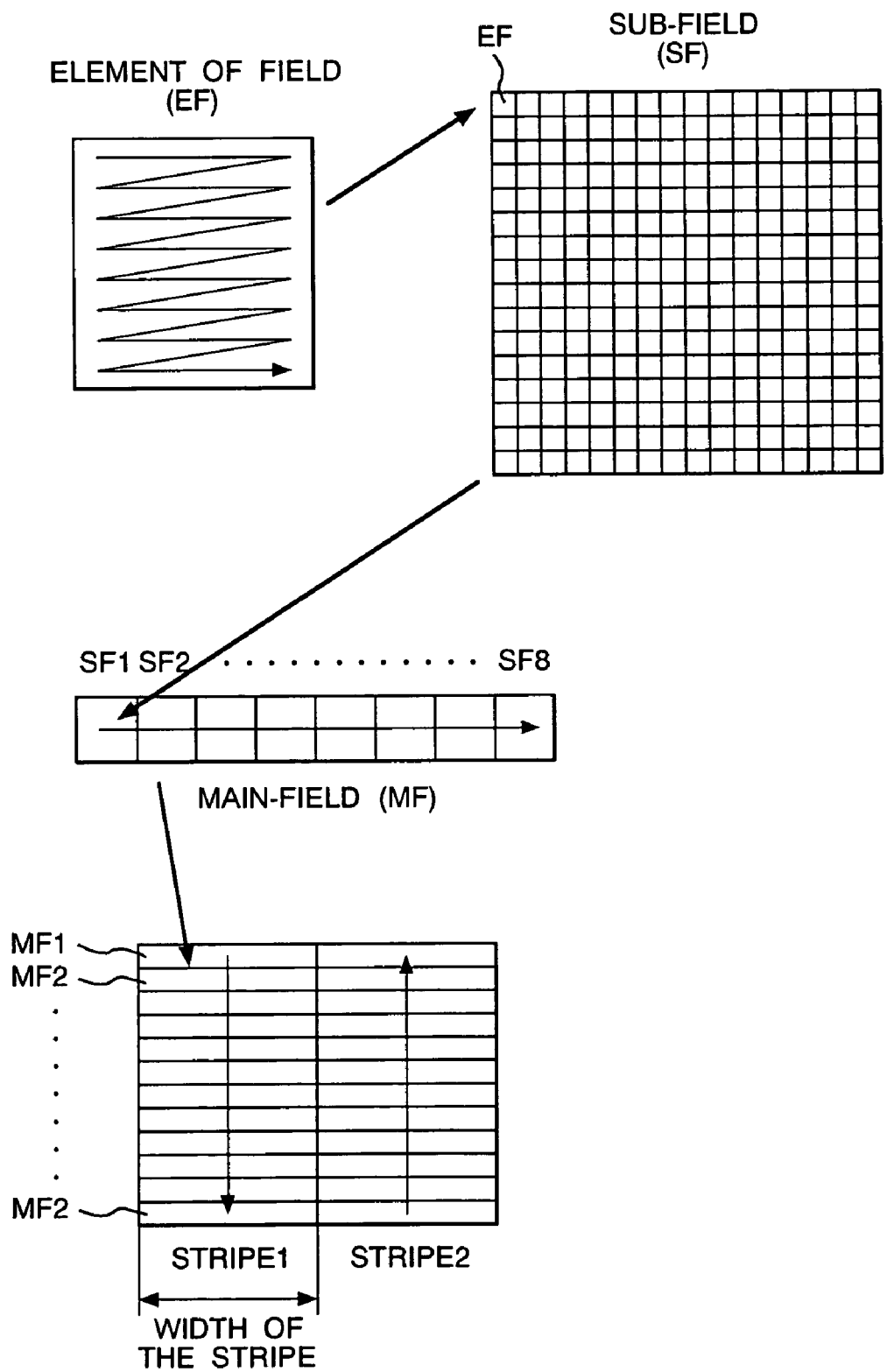
FIG. 9 is a diagram for explaining a multibeam type exposure system.

In the normal exposure method (when there are no bad beam properties), the stripe width becomes an integer multiplication of the width of the sub-field (eight times in FIG. 9).

Figure 15A:
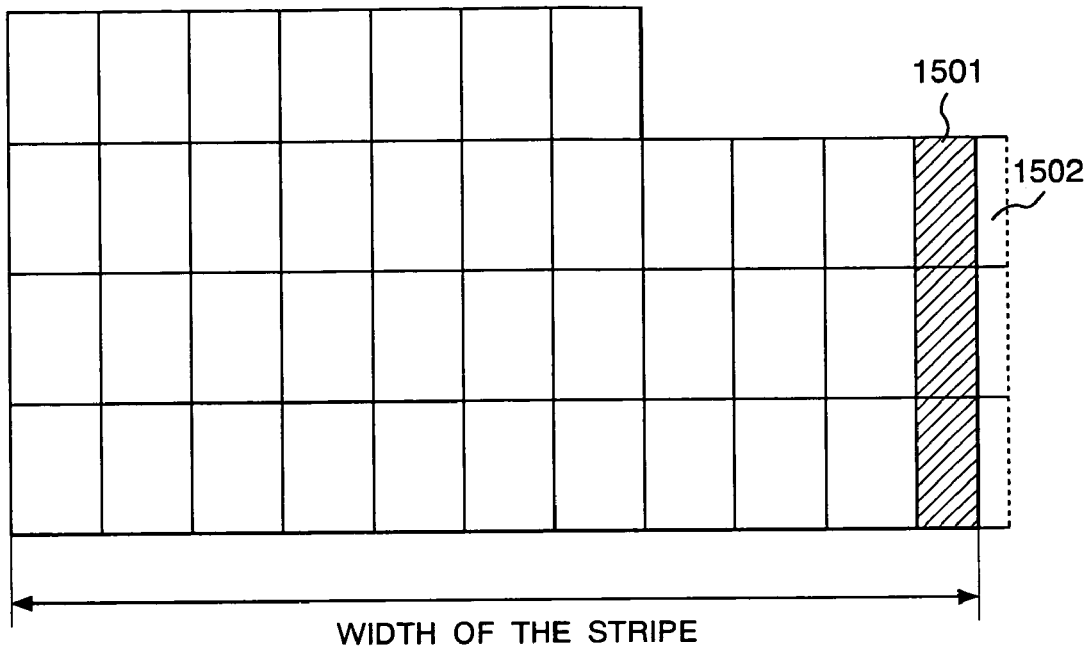
FIGS. 15a and 15b are diagrams showing the relationship between a stripe and a sub-field according to the fourth embodiment.
Figure 15B:
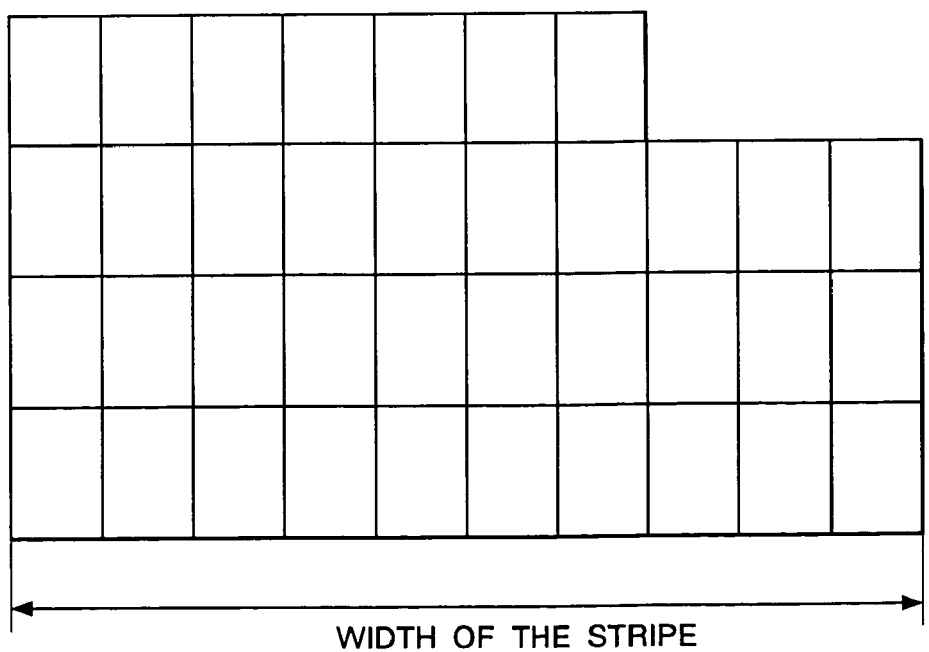

As the numbers of rows and columns of beams to be extracted by the movable shutter can be set arbitrarily in the embodiment, the degree of freedom of the shape of the sub-field is increased. Therefore, the normal stripe width need not be an integer multiplication of the width of the sub-field in the embodiment. That is, given that the stripe width is set equal to the one in the normal exposure, a surplus portion 1501 may be produced at an edge portion of the stripe as indicated by the hatched portion in FIG. 15a. To expose the surplus portion 1501, blank data 1502 should be put in a part of the sub-field to expose the surplus sub-field. From the viewpoint of the throughput, this scheme cannot be said to be efficient. To cope with it, the stripe width should be changed to become an integer multiplication of the width of the sub-field as shown in FIG. 15b.

Figure 16:
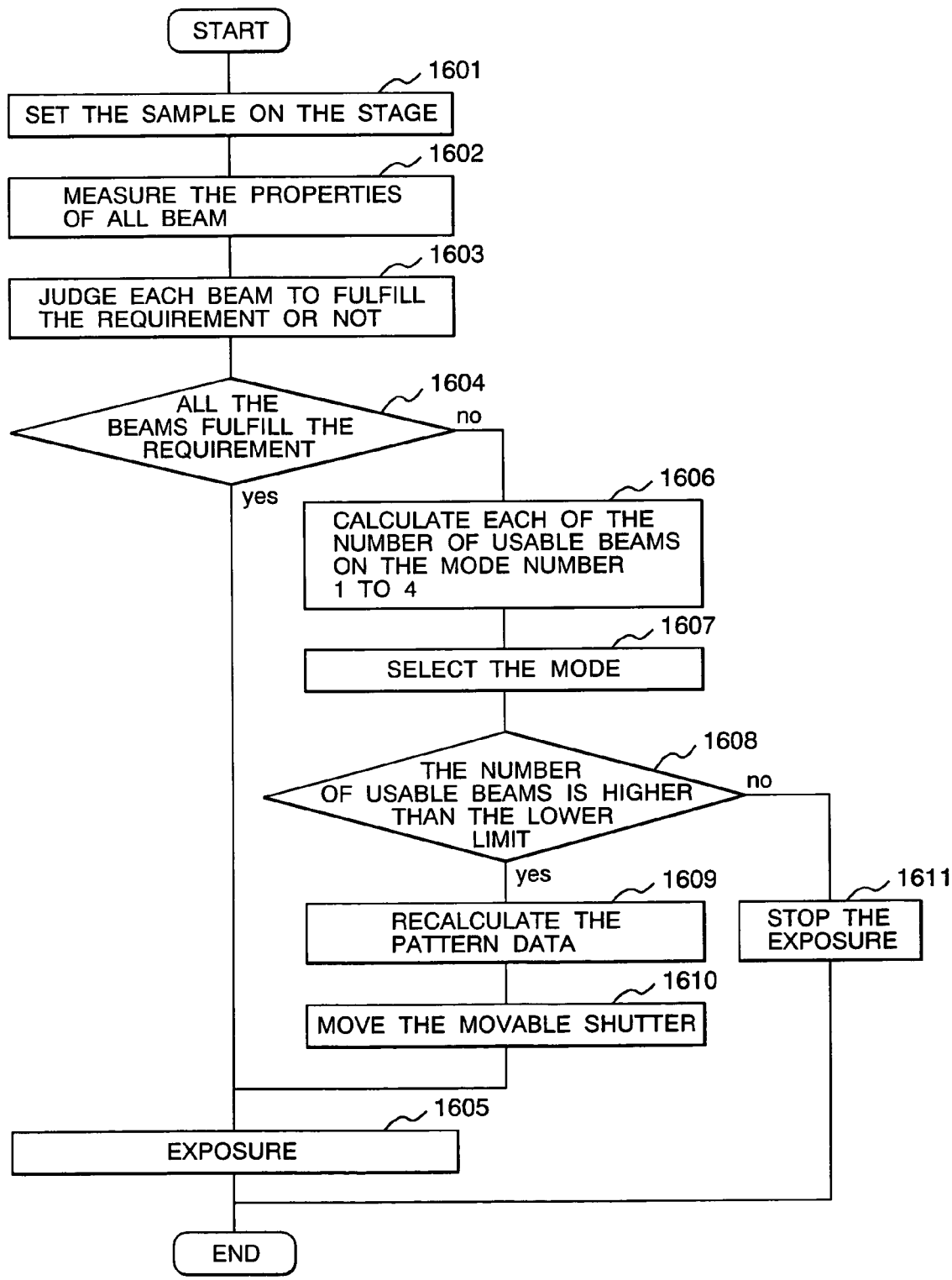
FIG. 16 is a flowchart for explaining an exposure method according to the fourth embodiment.

Referring to a flowchart illustrated in FIG. 16, the exposure procedures according to the embodiment will be described below.

After a sample is set on a stage (step 1601), the properties of all the beams to be used for exposure are measured (step 1602). The properties include the blanking property, the beam current and the beam shape. According to the result of measuring the beam properties, it is decided whether the requirement to achieve irradiation on the sample is fulfilled or not on all the beams (step 1603).

At step 1604, it is decided whether all the beams fulfill the requirement. When it is decided that all the beams fulfill the requirement, the individual beams are controlled based on the pattern data for exposure as done in the prior art (step 1605).

Figure 13A:
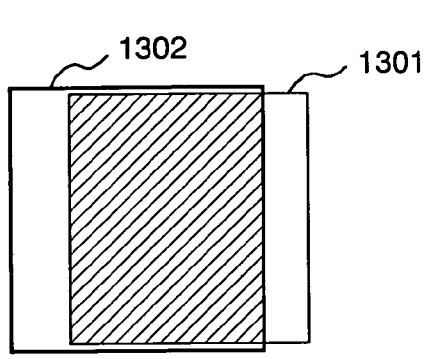
FIGS. 13a to 13e are diagrams for explaining how to extract a beam according to a fourth embodiment of the invention.
Figure 13B:
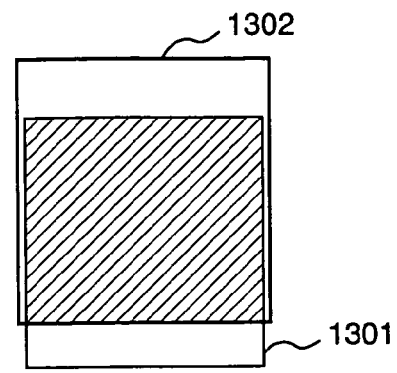
Figure 13C:
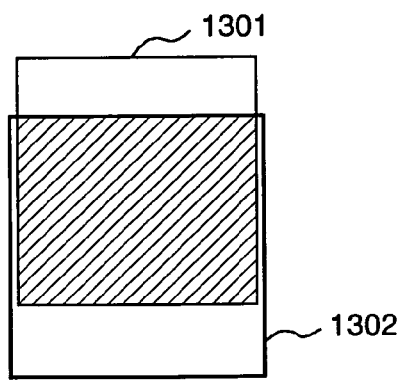
Figure 13D:
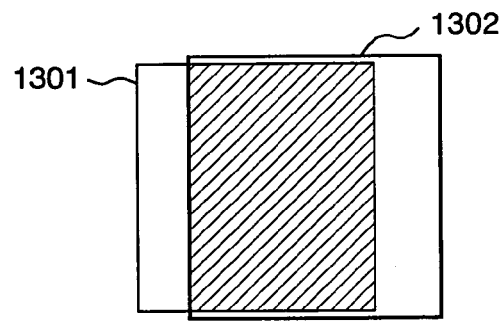

When it is decided that there is at least one beam which does not fulfill the requirement, a beam group comprised only of beams with good properties is extracted according to one of four modes in the embodiment. The four modes are a mode of blocking right-hand columns by the movable shutter without changing the number of rows as shown in FIG. 13a, a mode of blocking lower end rows by the movable shutter without changing the number of columns as shown in FIG. 13b, a mode of blocking upper end rows by the movable shutter without changing the number of columns as shown in FIG. 13c, and a mode of blocking left-hand columns by the movable shutter without changing the number of rows as shown in FIG. 13d. As the number of beams that pass the aperture of the movable shutter differs depending on the mode, the number of beams that pass the aperture of the movable shutter, i.e., the number of effective beams is computed when each of the four modes is employed. At step 1607, the mode in which the number of effective beams becomes the greatest is selected based on the result of computation at step 1606.

There may be a case where the number of effective beams becomes very small even with the use of the system of the embodiment, such as when a plurality of beams have bad properties. At step 1608, therefore, it is decided whether the number of effective beams exceeds a preset threshold or not. When it is decided at step 1608 that the number of effective beams exceeds the preset threshold, pattern data is recomputed according to the selection made at step 1607 (step 1609). Next, the movable shutter is moved according to the selection made at step 1607 (step 1610), and exposure is executed (step 1605).

When it is decided at step 1608 that the number of effective beams does not exceed the preset threshold, it is decided to stop exposure (step 1611), and a pattern is displayed on the screen or so for a user.

Through the above-described procedures, exposure can be carried out using only beams with good properties even when some electron beams fail due to failures in the associated multibeam forming devices. The time needed for beam irradiation becomes shorter than the time in the third embodiment. When one beam fails, for example, the time needed for beam irradiation becomes twice as high at most. When beams in the first quadrant and the third quadrant have bad properties, for example, the method of the third embodiment cannot perform exposure, whereas the fourth embodiment can carry out exposure.

Figure 13E:
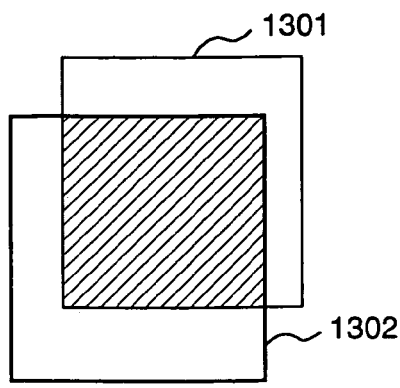
Figure 14B:
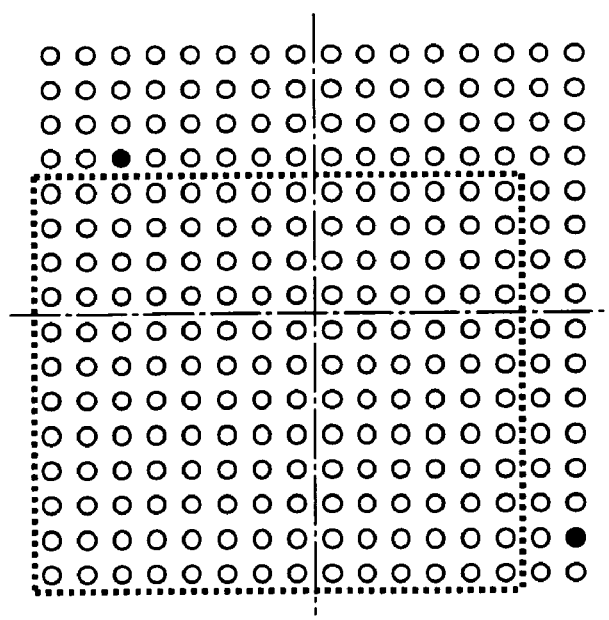

Further, the numbers of rows and columns of beams to be extracted by the movable shutter can be made variable as shown in FIG. 13e. As this method is used when a plurality of beams have bad properties as exemplified in FIG. 14b, beams can be extracted more efficiently in some cases.

(Fifth Embodiment)

In the fifth embodiment, the third embodiment is also applied to making the drop of the throughput originated from a failure in a multibeam forming device as small as possible.

In the embodiment, as in the third embodiment, the movable shutter 701 extracts a beam group comprised of those in the beams split by the aperture array with good properties. It is to be noted however that while the aperture of the movable shutter in the third embodiment has a square shape, the movable shutter has a cross shape in the fifth embodiment.

Figure 17A:
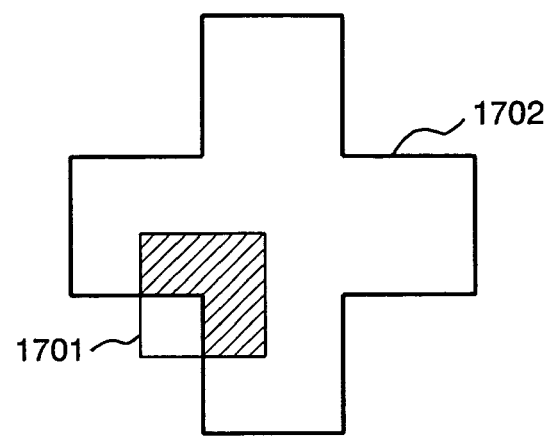
FIGS. 17a to 17c are diagrams for explaining how to extract a beam according to a fifth embodiment of the invention.
Figure 17B:
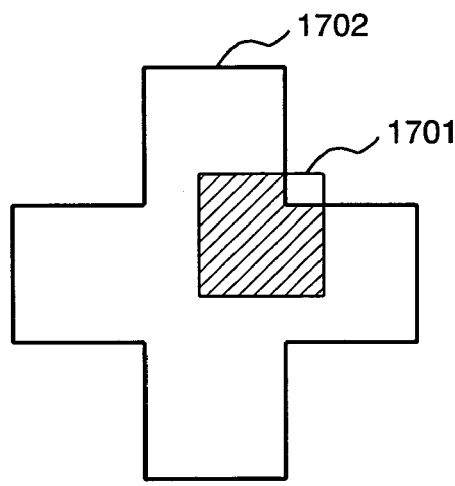
Figure 17C:
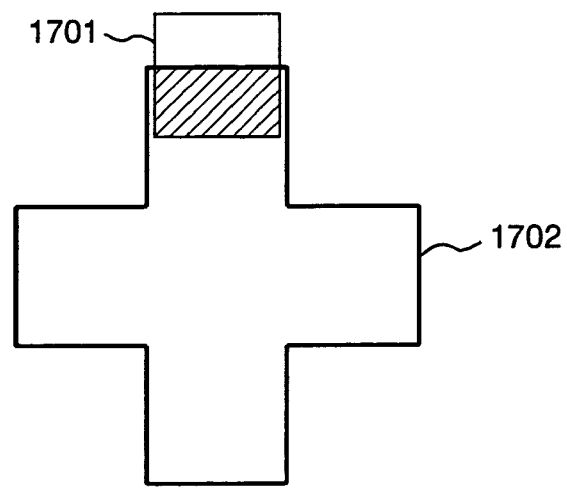

In FIGS. 17a to 17c, reference symbol "1701" indicates beams split by the aperture array and reference symbol "1702" indicates the aperture of the movable shutter. Designing the shape of the movable shutter to a cross shape can allow ¾ of the beams split by the aperture array to be extracted.

Figure 18A:
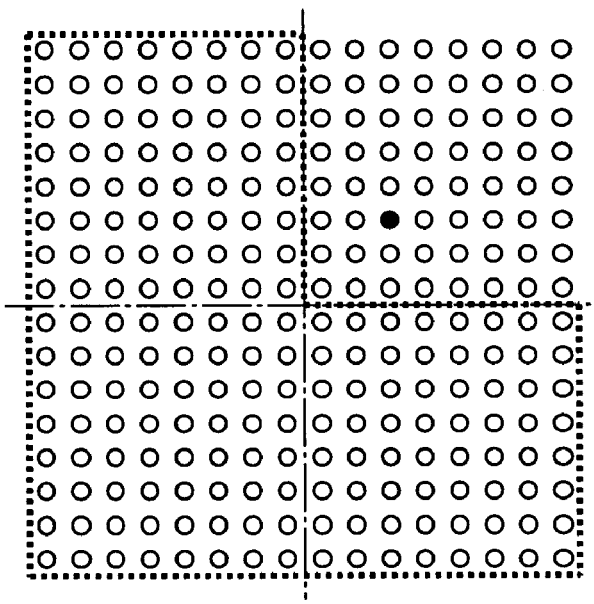
FIGS. 18a and 18b are diagrams showing the states of individual beams according to the fifth embodiment.

In FIG. 18, white circles (o) indicates beams with good properties and black circles (□) indicates beams with bad properties. When there is a beam with a good property, only the first quadrant of the beams split by the aperture array where a bad beam is present, i.e., ¼ of the entire beams are blocked by the movable shutter, and the remaining three quadrants from the second quadrant to the fourth one or the ¾ of the entire beams are passed to be used in exposure as shown in FIG. 18a.

This method is compared with the methods of the third and fourth embodiments in a case where the distribution of beams with bad properties is similar.

In the third embodiment, half of the entire blanker or 16×8 beams are extracted and used in exposure. In the fourth embodiment, 16×10 beams are extracted and used in exposure. In the fifth embodiment, however, the number of beams to be used in exposure is 16×16×¾, which is 1.5 times the quantity in the method of the third embodiment and 1.2 times the quantity in the method of the fourth embodiment.

Figure 18B:
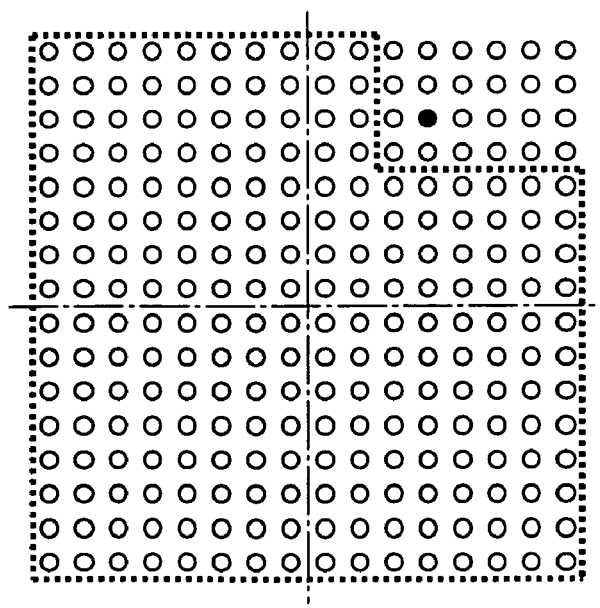

The beams to be extracted by the movable shutter can be given a greater degree of freedom as the numbers of rows and columns of beams to be extracted by the movable shutter are made variable by adjusting the relative positions of the beams formed by the aperture array and the movable shutter as shown in FIG. 17b. When there is a beam with a bad property at a peripheral portion, as shown in FIG. 18b, therefore, the number of beams usable in exposure is increased as indicated by the broken line.

Figure 19:
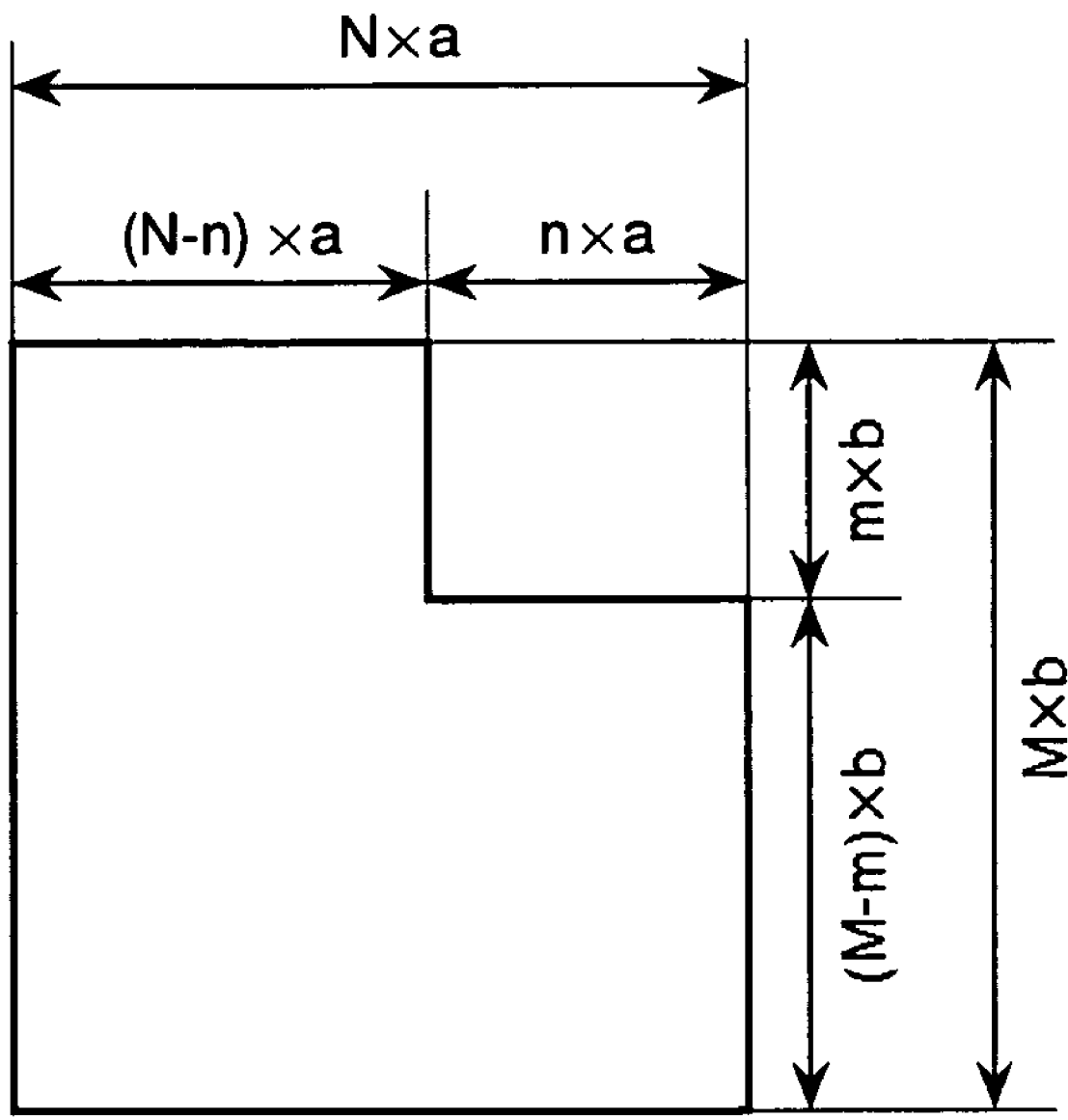
FIG. 19 is a diagram showing the shape of a sub-field according to the fifth embodiment.

When m×n beams at any of the four corners included in M×N beams split by the aperture array ate blocked by the cross-shaped movable shutter, the shape of a sub-field comprised of elements of field assigned to extracted beams becomes an L shape as shown in FIG. 19, provided that the lengths of sides of an element of field assigned to a single beam are a and b.

To fill a stripe without overlapping seamlessly using the shape, the intervals between adjoining sub-fields should be (M−m)×b and (N−n)×a.

Figure 20A:
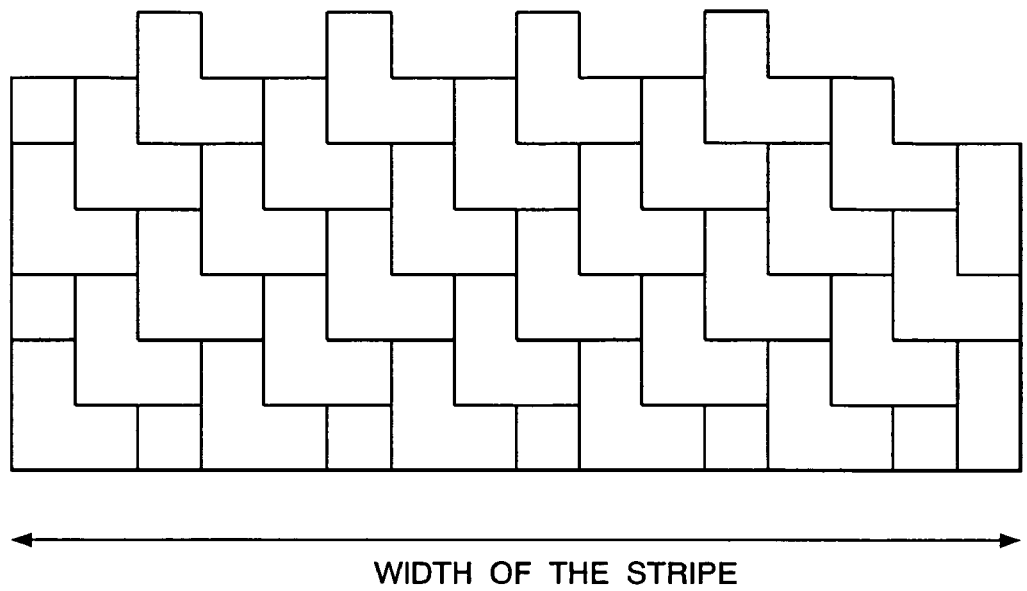
FIGS. 20a and 20b are diagrams showing the relationship between a stripe and a sub-field according to the fifth embodiment.
Figure 20B:
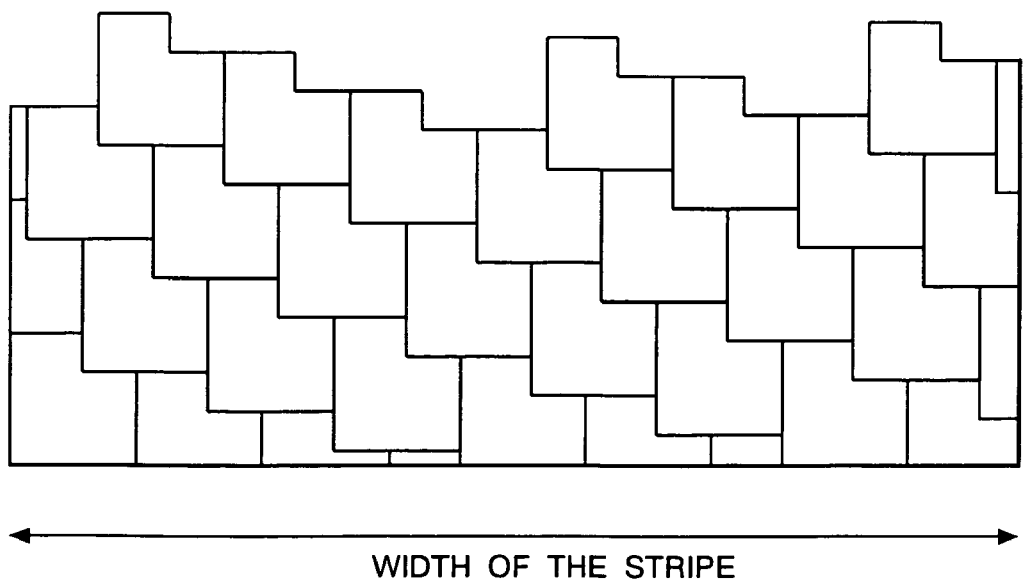

That is, when three quadrants are extracted and used in exposure, the relationship between a stripe and the regions to be exposed simultaneously becomes as shown in FIG. 20a. When beams to be extracted are given the degree of freedom, the relationship between a stripe and the regions to be exposed simultaneously becomes as shown in FIG. 20b.

As a system structure similar to the structure of the embodiment can extract beams formed by the aperture array in a rectangular shape as shown in FIG. 17c, the exposure method of the third embodiment or the fourth embodiment can be executed as well.

(Sixth Embodiment)

In the sixth embodiment, the drop of the throughput originated from a failure in a multibeam forming device is made as small as possible by adapting the third to fifth embodiments.

In the embodiment, as in the third embodiment, the movable shutter extracts a beam group comprised of those in the beams split by the aperture array with good properties. It is to be noted however that beams are extracted by a single movable shutter in the third to fifth embodiments, whereas beams are extracted by two shutters which are independently movable in the sixth embodiment. That is, the embodiment takes a double-level shutter structure having an upper shutter and a lower shutter.

Figure 21:
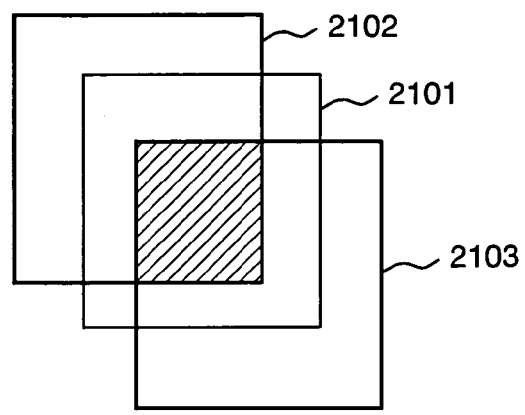
FIG. 21 is a diagram for explaining how to extract a beam according to a sixth embodiment of the invention.

In FIG. 21, reference symbol "2101" indicates beams split by the aperture array, reference symbol "2102" indicates the aperture of the upper movable shutter, and reference symbol "2103" indicates the aperture of the lower movable shutter. Arbitrary numbers of rows and columns of beams can be extracted at an arbitrary position as indicted by the hatched portion in the diagram by adjusting the shapes of the apertures of the movable shutters, and the relative positions of the beams formed by the aperture array and the movable shutters.

This can provide the beams to be extracted by the movable shutter with a greater degree of freedom, so that when there are a plurality of beams with bad properties, beams can be extracted efficiently.

(Seventh Embodiment)

Figure 22:
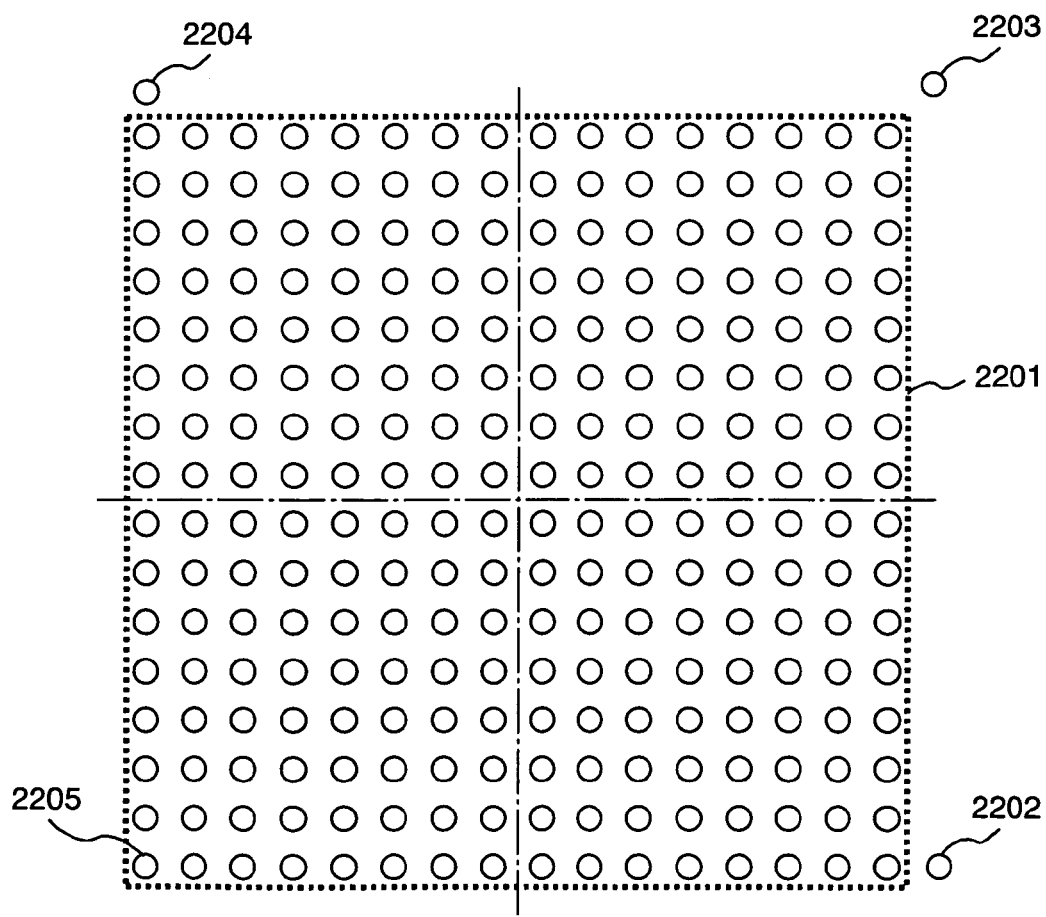
FIG. 22 is a diagram for explaining the layout of relief beams according to a seventh embodiment of the invention.

FIG. 22 shows the layout of beams which are formed by multibeam forming device's in a multibeam type electron beam exposure apparatus according to the seventh embodiment of the invention and are projected onto a sample. In the embodiment, there are M×N or 16×16 electron beams surrounded by a broken-line block 2201 which are to be used in exposure normally, i.e., when there are no beams with bad properties. Those beams are arrayed at equal pitches which are "1" on the sample surface. Thee are three relief beams 2202, 2203 and 2204 formed outside the three corners of the broken-line block 2201, namely the upper left corner, the upper right corner and the lower right corner. Relief exposure is executed by using a total of four relief beams or the three relief beams 2202, 2203 and 2204 and a beam 2205 located at the lower left corner in the array of 16×16 beams which are surrounded by the broken-line block 2201 and are used in normal exposure.

As the three relief beams are arranged outside the array of the array of 16×16 beams, which are surrounded by the broken-line block 2201 and are used in normal exposure, by one pitch of the array, the pitch of the four beams on the sample surface is 16×1.

The feature of the apparatus that forms the relief beams lies in the addition of multibeam forming devices for the relief beams and a control system for the relief beams.

Specifically, the aperture array is provided with apertures for the relief beams, the lens array is provided with lenses for the relief beams, the deflector array is provided with deflectors for the relief beams, and the blanker array is provided with blankers for the relief beams. In addition, a deflector control system and a blanker control system for the relief beams are provided to execute relief exposure using the relief beams.

The exposure process is carried out as follows by using the relief beams.

When there is beam with a bad property in the 16×16 beams surrounded by the broken-line block 2201, the beam with a bad property is blocked by the same method as used in the first embodiment of the second embodiment, and then normal exposure is performed. The exposure method in use is a method similar to the conventionally proposed multi-beam exposure method that has been explained in the foregoing description of the third embodiment referring to FIG. 9. At this time, the relief beams are also blocked to the sample by the associated blankers. As a result, elements of field corresponding to the beam with a bad property are not exposed in all the sub-fields. The interval between the elements of field which have not been exposed due to blocking of the beams is equal to the interval between the sub-fields or 16×1.

Figure 23A:
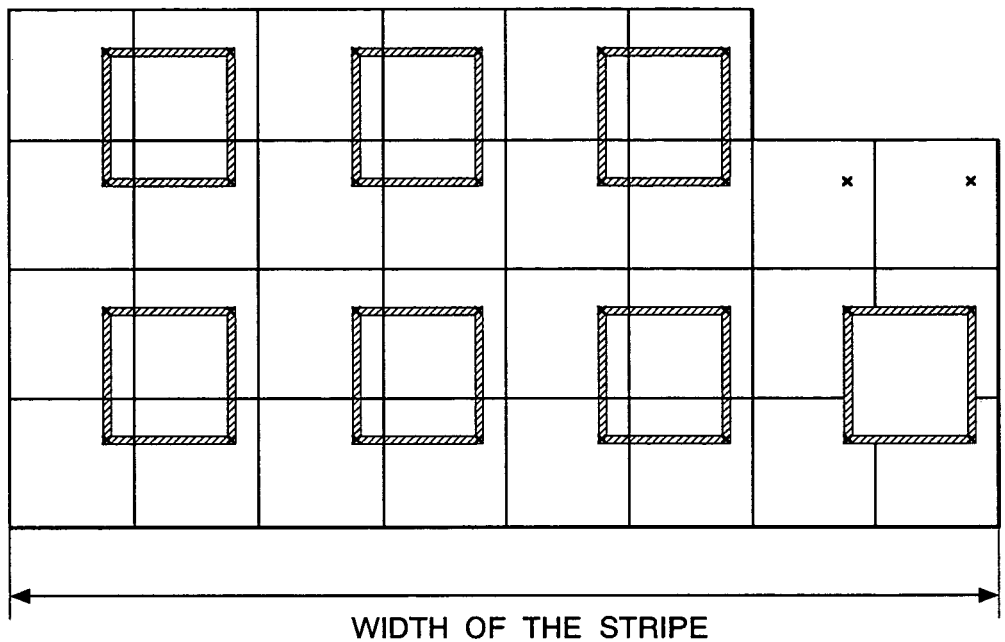
FIGS. 23a and 23b are diagrams showing the relationship between a stripe and a sub-field according to the seventh embodiment.

Next, exposure of those elements of field which should originally be exposed by blocked beams or relief exposure is executed by using a total of four beams, namely the three relief beams 2202, 2203 and 2204 and the beam 2205 located at the lower left corner in the array of 16×16 beams which are surrounded by the broken-line block 2201 and are used in normal exposure. At this time, the interval between the four beams and the interval between the elements of field which should be exposed are both 16×1. As shown in FIG. 23*a*, therefore, the elements of field that are lost due to the bad properties of four sub-fields can be exposed at a time in relief exposure by using the four beams. This can be said as utilization of the fact that a field constructed by the four beams to be used in relief exposure is larger by one pitch than a field constructed by 16×16 beams to be used in normal exposure (maximum allowable exposure region).

When one beam has a bad property, therefore, a region which is conventionally exposed as four sub-fields can be exposed in a time equivalent to the time for exposure of five sub-fields. That is, an increase in beam irradiation time can be suppressed to 25%, regardless of the location of a beam which has a bad property. When two ore more beams have bad properties, an increase in beam irradiation time is 25% per beam with a bad property. For up to three bad properties, therefore, the beam irradiation time can be made shorter than that achieved by the method of the first embodiment.

In the embodiment, relief exposure is executed using three relief beams and the beam at the lower left corner, a total of four beams. In other words, the beam 2205 at the lower left corner is used in relief exposure as well as in normal exposure. This requires that data for controlling the blanker at the lower left corner should be computed and transferred serially for each of the normal exposure and the relief exposure, which may limit the exposure speed.

Figure 23B:
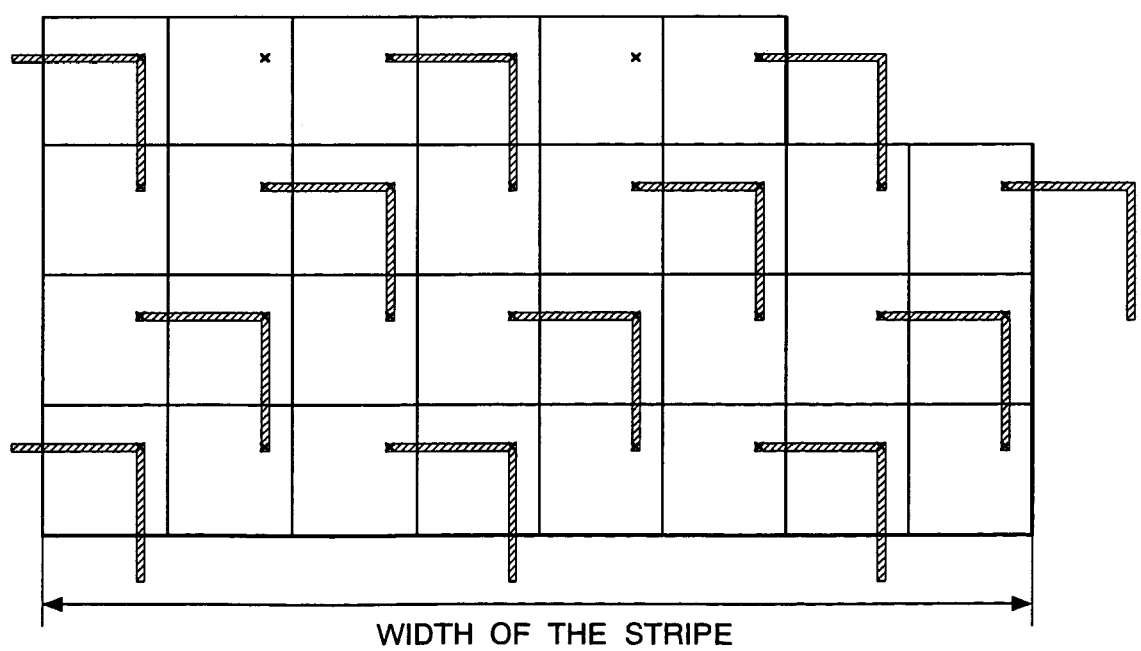

In this respect, relief exposure is executed using the three relief beams 2202, 2203 and 2204 alone without using the beam 2205 at the lower left corner. At this time, elements of field which are lost due to bad properties for three sub-fields are exposed simultaneously in relief exposure as shown in FIG. 23*b*. This can isolate blankers to be controlled in normal exposure from those in relief exposure, making it possible to perform data computation and transfer for blanker control in parallel. As compared with the case where relief exposure is performed using four beams, while the beam irradiation time is increased, the data computation time and the data transfer time are shortened, thus making the time needed for the exposure process shorter.

(Eighth Embodiment)

Figure 24:
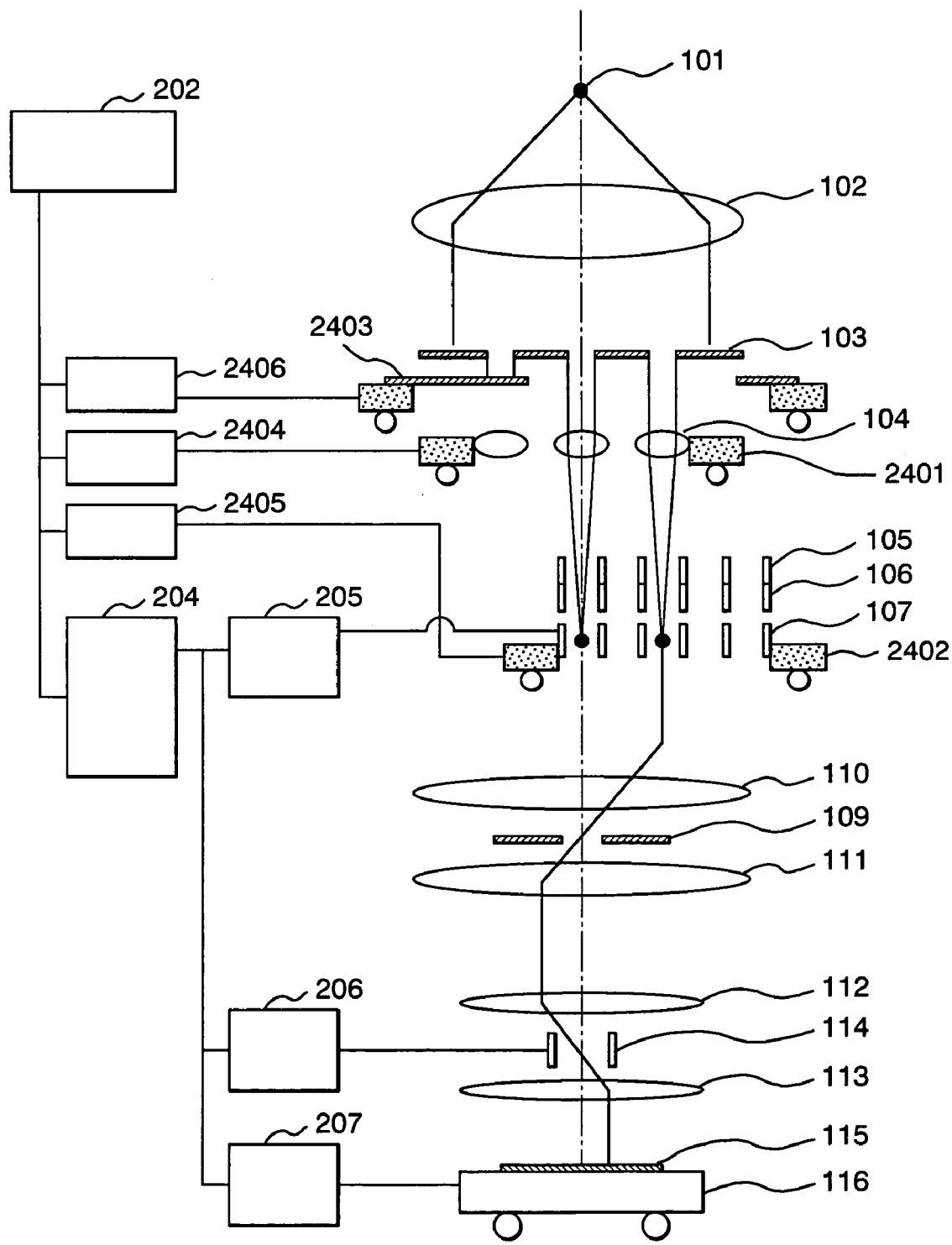
FIG. 24 is a structural diagram of a multibeam type electron beam exposure apparatus according to an eighth embodiment of the invention.

FIG. 24 shows the structure of a multibeam type electron beam exposure apparatus according to the eighth embodiment of the invention.

With a crossover 101 being a light source, a condenser lens 102 forms approximately parallel electron beams. Reference symbol "103" is an aperture array having apertures arrayed two-dimensionally. Reference symbol "104" is a lens array having electrostatic lenses having the same focal length arrayed two-dimensionally. The lens array 104 is mounted on a stage 2401 which moves in a plane perpendicular to the beam axis. Reference symbols "105" and "106" are deflector arrays each having a two-dimensional array of electrostatic deflectors which can be driven individually. Reference symbol "107" is a blanker array having a two-dimensional array of electrostatic blankers which can be driven individually. The deflector arrays 105 and 106 and the blanker array 107 are mounted on a stage 2402 which moves in a plane perpendicular to the beam axis.

The approximately parallel electron beams formed by the condenser lens 102 are split into a plurality of electron beams by the aperture array 103. The split electron beams enter the electrostatic lenses in the lens array 104. The position of the stage 2401 determines which lenses in the lens array 104 the beams split by the aperture array 103 enter. The lens array 104 gives convergence to the beams input to the lenses, thereby forming intermediate images of the crossover 101 at the height of the blanker array 107. At this time, the position of the stage 2402 determines which blankers in the blanker array 107 the beams caught by the lens array 104 enter.

A movable shutter 2403 is provided between the aperture array 103 and the lens array 104 to cause the beams split by the aperture array 103 to selectively reach the sample. In the embodiment, the movable shutter 2403 comprises two shutters which can independently move. Arbitrary numbers of rows and columns of beams can be extracted at an arbitrary position by adjusting the shape of the aperture of the movable shutter 2403, and the relative positions of the beams formed by the aperture array 103 and the movable shutter 2403.

Specifically, the stage 2401, the stage 2402 and the movable shutter 2403 are statically controlled by a stage control circuit 2404, a stage control circuit 2405 and a shutter control circuit 2406. A pattern control circuit 204 dynamically controls a blanker control circuit 205, a deflector control circuit 206 and a stage control circuit 207 to irradiate a beam based on pattern data onto a sample 115. The stage control circuit 2404, the stage control circuit 2405, the shutter control circuit 2406 and the pattern control circuit 204 are controlled by a control computer 202 which is the interface to an operator.

Figure 25:
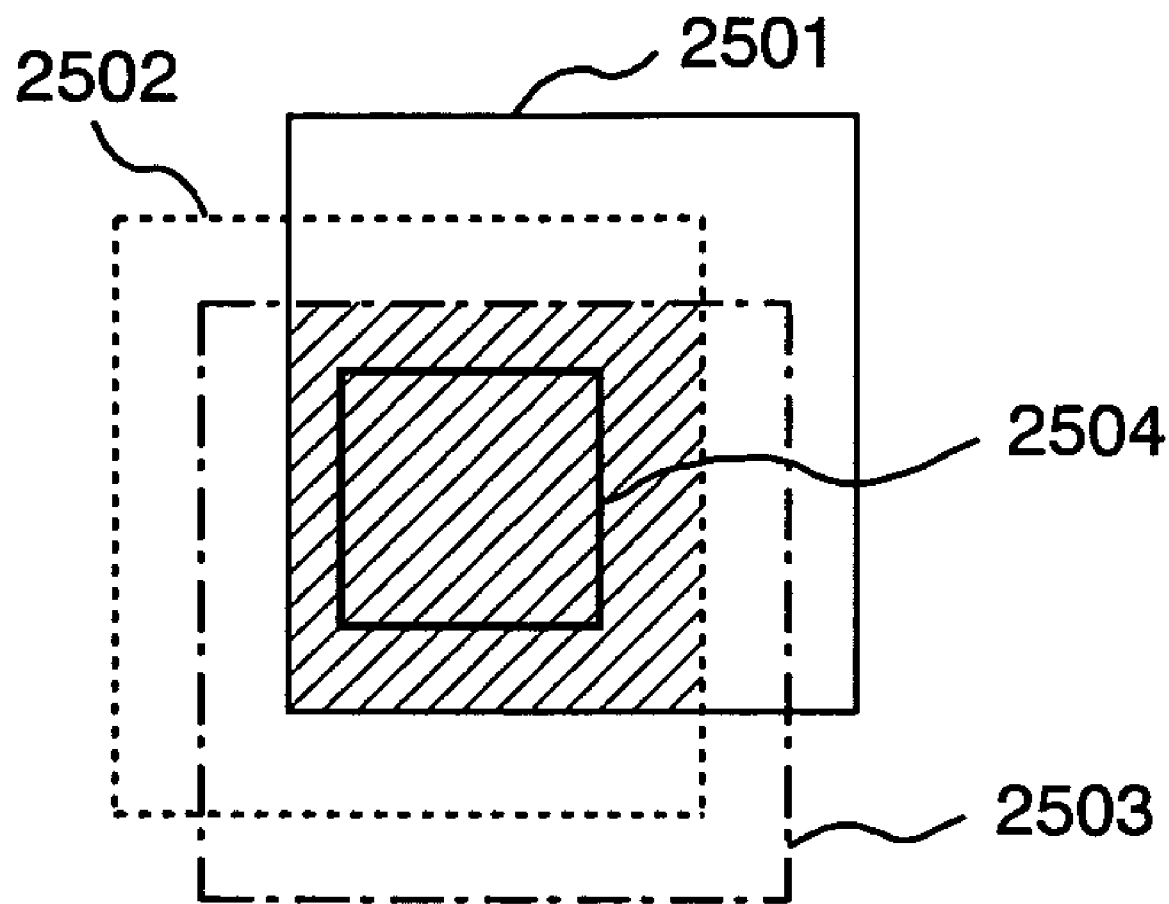
FIG. 25 is a diagram for explaining how to extract a row and a column at an arbitrary position according to the eighth embodiment.

Referring to FIG. 25, extraction of arbitrary rows and columns at an arbitrary position in the embodiment will be described below.

A solid-line block 2501 indicates beams split by the aperture array 103. A one-dot chain line block 2502 indicates the array of lenses in the lens array 104. A one-dot chain line block 2503 indicates the array of blankers in the blanker array 107. Therefore, the hatched portion indicates beams which are affected by the aperture array 103, the lens array 104 and the blanker array 107.

That portion of the beams 2501 split by the aperture array which excludes the hatched portion indicates beams which do not have associated lenses or blankers. From the viewpoint of contamination, it is not desirable to irradiate the beams to the lens array or the blanker array.

Accordingly, the movable shutter 2403 blocks beams which do not have associated lenses or blankers. As there may be a case where the beams which are affected by the aperture array 103, the lens array 104 and the blanker array 107 include a beam with a bad property, the movable shutter 2403 blocks this beam too. A thick-line block 2504 indicates beams which pass through the aperture of the movable shutter.

That is, the thick-line block 2504 can be said to indicate beams with good properties which are well worked out by the multibeam forming devices. The position of the stages 2401 and 2402, the aperture shape and the position of the movable shutter 2403 are adjusted in such a way as to maximize the number of beams which are split by the aperture array 103, pass through the aperture of the movable shutter and well undergo convergence in the lens array 104.

Accordingly, the array of beams with good properties can be made as large as possible, and unnecessary beams can be blocked by the movable shutter. The array of beams with good properties selected by the movable shutter is projected in reduced size on the sample 115 set on the stage 116 by the electromagnetic lenses 110, 111, 112 and 113. The position of the size-reduced projected image is determined by the amount of deflection of the deflector 114.

Although movement of the stages is used to select the lenses and blankers to pass the beams split by the aperture array in the embodiment, an aligner may be used to bring about a similar effect. Specifically, an aligner is provided between the aperture array and the lens array to adjust the irradiation position of the lens array. Another aligner is provided between the lens array and the blanker array to adjust the irradiation position of the blanker array.

By blocking beams which do not have associated lenses or blankers by the movable shutter, the array of beams with good properties can be made as large as possible, and unnecessary beams can be blocked by the movable shutter.

The following will discuss one example of an evaluation method for the properties of individual beams in the multibeam exposure method, which is essential in executing exposure using only beams with good properties.

As the invention aims at selecting beams with desired properties from a plurality of multiple beams, properties common to all of multiple beams, such as aberration originated from the irradiation optical system and the objective optical system and the position accuracy of the stage, are not dealt with. Besides a bad property of each beam brought about by a failure in a multibeam forming device, a variation in the properties of individual beams is caused by irregular irradiation by the irradiation optical system, a deviation from the telecentric system and deformation by the objective optical system. The invention is therefore effective in those points. That is, the following four properties should be measured and evaluated whether they fulfill the desired property or not for all of the beams.

(1) Spot shape on the sample (2) Spot position on the sample (3) Change in properties (1) and (2) with time (4) Blanking property With regard to the properties (1) to (3), the size and position of each electron beam converged on the sample can be measured by using, for example, a linear measurement mark placed perpendicular to the scan direction of electron beams.

With regard to the property (4), specifically, whether irradiation or blocking of each beam to the sample is controlled well or not should be checked. That is, the beam current should be measured in cases where a voltage is applied to a blanker associated with each be and where no voltage is applied in the static control, and the response of the beam current to the voltage applied to a blanker should be measured in the dynamic control. To achieve the measurement, the level of the current of each electron beam can be measured with high precision and high speed by using, for example, a Faraday cup which is made of a heavy metal, such as tantalum, or a heavy metal with a larger atomic number than that of tantalum, and has a high aspect ratio.

In the example, provided that the properties listed above were measured and evaluated for all of the beams, the position of the movable shutter was adjusted once a day to perform exposure using only those beams which have the desired property by using, for example, the method of the third embodiment. Depending on the degree of stability of the multibeam forming devices, the frequency of adjustment may be reduced to once a week or may be increased lot by lot or sample by sample.

There is a possibility that improperness of a specific beam, which has not been detected from the results of measuring the four properties, becomes apparent through inspection of the result of exposure. In this respect, the inspection becomes more efficient if a QC (Quality Control) pattern more sensitive to a variation in the properties of the individual beams than a device pattern is exposed and is inspected. Alternatively, should a QC pattern be always exposed on each sample where a device pattern is to be exposed, a variation in the properties of beams can be monitored by executing extraction inspection at the adequate timing.

The exposure accuracy demanded may change within the same sample depending on the position in the sample. That is, there may be a case where the threshold for the properties of the individual beams differs within a sample. In such a case, the number of electron beams to be used in exposure can be changed during exposure of the same sample based on the properties of the individual beams measured in advance. That is, the throughput can be improved as high as possible by always executing exposure with the lowest property required.

Although the foregoing description of the embodiments has been given of the case where multiple beams are formed by using a single electron source, the invention is not limited to this case but can be adapted to exposure equipment constructed to form multiple beams using a plurality of electron sources. The invention is not restrictive to the use of electron beams, but is also effective when adapted to multibeam type electron exposure equipment using charged-particle beams such as ion beams.

What is claimed is:

1. A method of charged-particle beam lithography which forms a plurality of charged-particle beams arranged at predetermined intervals, and individually blanks said plurality of charged-particle beams using blanking means to irradiate a charged-particle beam according to a pattern to be exposed on an exposure target, wherein an exposure process is executed by blocking that specific beam in said plurality of charged-particle beams which is not suited for exposure to said exposure target by another means from said blanking means.

2. A method of charged-particle beam lithography which forms a plurality of charged-particle beams arranged at predetermined intervals, and individually blanks said plurality of charged-particle beams to irradiate a charged-particle beam according to a pattern to be exposed on an exposure target, said method comprising the steps of:
   individually measuring properties of said plurality of charged-particle beams;
   selecting a group of beams comprised of those of said measured charged-particle beams which fulfill a predetermined criterion as beams to be used in exposure;
   normally blocking remaining beams to said exposure target during exposure; and
   exposing said exposure target using said selected beams.

3. A method of charged-particle beam lithography which individually assigns elements of field to a plurality of charged-particle beams based on pattern data to be exposed, and irradiates a charged-particle beam according to said pattern data to be exposed on an exposure target, said method comprising:
   a first step of individually measuring properties of said plurality of charged-particle beams;
   a second step of selecting a group of beams comprised of those of said charged-particle beams whose properties measured at said first step fulfill a predetermined criterion as beams to be used in exposure, and normally blocking remaining beams to said exposure target during exposure;
   a third step of exposing said elements of field assigned to said beams selected for exposure at said second step using said selected beams;
   a fourth step of selecting beams for exposure of those elements of field which are assigned to said beams blocked at said second step, in place of said blocked beams, from those of said charged-particle beams whose properties measured at said first step fulfill said criterion; and
   a fifth step of exposing said elements of field assigned to said beams blocked at said second step using said beams selected at said fourth step.

4. The method of charged-particle beam lithography according to claim 3, wherein a maximum field size in those elements of field at said fifth step is greater than a maximum field size in those elements of field at said third step.

5. A method of charged-particle beam lithography having a step of deflecting a plurality of charged-particle beams arranged in an M×N matrix according to a pattern to be exposed while continuously moving a stage on which an exposure target is set, with a minimum deflection width as a unit, individually controlling irradiation of beams for each deflection, and exposing said pattern on elements of field respectively assigned to said plurality of charged-particle beams, thereby exposing a sub-field comprised of M×N elements of field, a step of exposing a main-field comprised of a plurality of sub-fields laid out in a direction orthogonal to a direction of said continuous movement by sequentially exposing said plurality of sub-fields, said method comprising:
   a first step of individually measuring properties of said plurality of charged-particle beams;
   a second step of selecting a group of sequential m×n beams comprised of those of said charged-particle beams whose properties measured at said first step fulfill a predetermined criterion as beams to be used in exposure, and normally blocking remaining beams to said exposure target during exposure; and
   a third step of performing exposure taking m×n elements of field assigned to said beams for exposure selected at said second step as a single sub-field.

6. Equipment for charged-particle beam lithography, comprising:
   means for forming a plurality of charged-particle beams arranged at predetermined intervals;
   first blanking means which acts on said plurality of charged-particle beams individually;
   second blanking means which acts on all of said plurality of charged-particle beams; and
   restriction means for causing those charged-particle beams which are given predetermined deflection by said first blanking means to reach onto an exposure target, with a signal applied to said second blanking means, and blocking those charged-particle beams which are not given said predetermined deflection by said first blanking means to said exposure target.

7. The equipment for charged-particle beam lithography according to claim 6, wherein said first blanking means is comprised of a plurality of blankers which act on said plurality of charged-particle beams individually, and said second blanking means is accomplished by a common blanker.

8. Equipment for charged-particle beam lithography which forms a plurality of charged-particle beams arranged at predetermined intervals, and blanks said plurality of charged-particle beams using first blanking means to irradiate a charged-particle beam according to a pattern to be exposed on an exposure target, comprising:
   second blanking means located at an upstream of said first blanking means and comprised of a plurality of blankers which act on said plurality of charged-particle beams individually; and control means for controlling said first blanking means and said second blanking means in such a way as to cause those of said measured charged-particle beams which fulfill a predetermined criterion to reach said exposure target, and block those charged-particle beams which do not fulfill said criterion to said exposure target.

9. Equipment for charged-particle beam lithography, comprising:
   means for forming a plurality of charged-particle beams arranged at predetermined intervals;
   blanking means having a plurality of blankers which act on each of said plurality of charged-particle beams individually; and
   restriction means which causes those charged-particle beams which are given predetermined deflection by said blanking means to reach onto an exposure target, blocks those charged-particle beams which are not given said predetermined deflection by said blanking means to said exposure target, and is so arranged as to be eccentric to beam axes of said charged-particle beams.

10. Equipment for charged-particle beam lithography, comprising:
    means for forming a plurality of charged-particle beams arranged at predetermined intervals;
    blanking means which acts said plurality of charged-particle beams individually;
    means for irradiating a charged-particle beam according to pattern data to be exposed on an exposure target as said plurality of charged-particle beams are blanked individually by said blanking means;
    shutter means which is provided movable in a plane approximately perpendicular to a traveling direction of said charged-particle beam on a traveling path of said charged-particle beam and has an aperture capable of selectively passing said plurality of charged-particle beams; and
    control means which controls said pattern data in such a way that exposure is carried out with that charged-particle beam which is caused to selectively pass through said aperture of said shutter means.

11. The equipment for charged-particle beam lithography according to claim 10, wherein said aperture of said shutter means has a rectangular shape or a cross-like shape.

12. The equipment for charged-particle beam lithography according to claim 10, wherein said shutter means includes two shutters provided independently movable in a plane approximately perpendicular to said traveling direction of said charged-particle beam on said traveling path of said charged-particle beam.

13. Equipment for charged-particle beam lithography, comprising:
    charged-particle forming means for forming a plurality of charged-particle beams arranged in an M×N matrix;
    blanking means having M×N blankers which act said plurality of charged-particle beams individually;
    M×N lenses for individual converging said plurality of charged-particle beams;
    means for irradiating said charged-particle beams according to pattern data to be exposed on an exposure target;
    means for forming relief charged-particle beams to relieve beams with bad properties whose traveling to said exposure target is blocked by said blanking means when said beams with said bad properties are present in said plurality of charged-particle beams;
    a relief lens for individually conversing said relief charged-particle beams formed;
    relieve blanking means for individually blanking said relief charged-particle beams; and
    a relief blanker control circuit which individually controls said relief blanking means, whereby those elements of field which are assigned to said blocked beams are exposed with said relief charged-particle beams.

14. Equipment for charged-particle beam lithography comprising:
    an aperture array having a plurality of apertures for forming a plurality of charged-particle beams arranged at predetermined intervals;
    a lens array having a plurality of lenses laid out to individually convert said plurality of charged-particle beams which pass said aperture array;
    a first stage arranged in such a way as to make said lens array movable in a direction approximately perpendicular to a traveling direction of said charged-particle beams;
    a blanker array having a plurality of blankers which individually act on said plurality of charged-particle beams that pass;
    a second stage arranged in such a way as to make said blanker array movable in a direction approximately perpendicular to said traveling direction of said charged-particle beams;
    a shutter having an aperture capable of selectively passing said plurality of charged-particle beams;
    a third stage arranged in such a way as to make said shutter movable in a direction approximately perpendicular to said traveling direction of said charged-particle beams; and
    control means which controls positions of said first stage, said second stage and said third stage, and a shape of said aperture of said shutter in such a way as to maximize the number of those charged-particle beams which pass properly functioning apertures of said aperture array, pass properly functioning lenses in said lens array, pass properly functioning blankers in said blanker array and pass said shutter.

* * * * *